(12) United States Patent
Ivanov

(10) Patent No.: US 8,552,788 B2
(45) Date of Patent: Oct. 8, 2013

(54) APPARATUS AND METHODS FOR ADAPTIVE COMMON-MODE LEVEL SHIFTING

(75) Inventor: Evgueni Ivanov, Wilmington, MA (US)

(73) Assignee: Analog Devices, Inc., Norwood, MA (US)

( * ) Notice: Subject to any disclaimer, the term of this patent is extended or adjusted under 35 U.S.C. 154(b) by 92 days.

(21) Appl. No.: 13/233,792

(22) Filed: Sep. 15, 2011

(65) Prior Publication Data

US 2013/0069706 A1 Mar. 21, 2013

(51) Int. Cl.
  *H03L 5/00* (2006.01)
(52) U.S. Cl.
  USPC ............................................. 327/333
(58) Field of Classification Search
  None
  See application file for complete search history.

(56) References Cited

U.S. PATENT DOCUMENTS

| | | | |
|---|---|---|---|
| 5,300,896 A | 4/1994 | Suesserman | |
| 5,351,050 A * | 9/1994 | Thompson et al. | 341/143 |
| 5,703,589 A * | 12/1997 | Kalthoff et al. | 341/172 |
| 5,726,600 A | 3/1998 | Raghavan et al. | |
| 6,147,522 A * | 11/2000 | Rhode et al. | 327/93 |
| 6,249,696 B1 | 6/2001 | Olson et al. | |
| 6,396,343 B2 | 5/2002 | Chee | |
| 6,538,503 B2 | 3/2003 | Burt | |
| 6,559,720 B1 | 5/2003 | Huijsing et al. | |
| 6,844,775 B2 | 1/2005 | Doorenbos et al. | |
| 7,109,797 B1 | 9/2006 | Turvey | |
| 7,148,734 B2 | 12/2006 | Tanzawa | |
| 7,167,029 B2 | 1/2007 | Soeraasen | |
| 7,167,051 B2 | 1/2007 | Botker | |
| 7,193,457 B2 | 3/2007 | Douts et al. | |
| 7,202,738 B1 | 4/2007 | Huijsing et al. | |
| 7,368,999 B2 | 5/2008 | Natzke | |
| 7,453,305 B2 | 11/2008 | Moane et al. | |
| 7,521,994 B2 | 4/2009 | Theus et al. | |
| 7,633,317 B2 | 12/2009 | Miranda et al. | |
| 7,948,270 B1 * | 5/2011 | Evans et al. | 326/82 |
| 2003/0122624 A1 | 7/2003 | Tomasini et al. | |
| 2006/0119412 A1 | 6/2006 | Wei et al. | |
| 2006/0176109 A1 | 8/2006 | Huijsing et al. | |
| 2007/0013440 A1 | 1/2007 | Chen et al. | |
| 2008/0061857 A1 | 3/2008 | Kapusta | |
| 2009/0115507 A1 | 5/2009 | Cho | |

OTHER PUBLICATIONS

Stitt, R. Mark, *AC Coupling Instrumentation and Difference Amplifiers* (1990), 4 pages (available at World Wide Web page : ti.com/analog/docs/litabsmultiplefilelist.tsp?literatureNumber=sboa003&docCategoryId=1&familyId=1613).

(Continued)

*Primary Examiner* — Lincoln Donovan
*Assistant Examiner* — Khareem E Almo
(74) *Attorney, Agent, or Firm* — Knobbe Martens Olson & Bear LLP

(57) ABSTRACT

Apparatus and methods for adaptive level shifting are provided. In one embodiment, a method of level shifting in an adaptive level shifter (ALS) is provided. The technique includes charging a first capacitor and a second capacitor each to a voltage that is about equal to a difference between a common mode voltage of a differential input voltage signal and a reference voltage. The technique can further include inserting the first capacitor between a first input and a first output of the ALS and the second capacitor between the second input and a second output of the ALS. The technique can further include switching the first capacitor and the second capacitor such that the first capacitor is inserted between the second input and the second output and the second capacitor is inserted between the first input and the first output.

23 Claims, 12 Drawing Sheets

(56) References Cited

OTHER PUBLICATIONS

Fortunato, Mark, *A New Filter Topology for Analog High-Pass Filters* (2008), 8 pages (available at World Wide Web page: ti.com/lit/an/slyt299/slyt299.pdf).

Analog Devices AD8129/AD8130 Data Sheet, *Low Cost 270 MHz Differential Receiver Amplifiers* (2005), 40 pages (available at World Wide Web page: analog.com/en/specialty-amplifiers/differential-amplifiers/ad8130/products/product.html).

Texas Instruments INA333 Datasheet, *Micro-Power (50 μA), Zer0-Drift-to-Rail Out Instrumentation Amplifier* (Oct. 2008), 26 pages (available at World Wide Web page: ti.com/lit/ds/symlink/ina333.pdf).

Fan et al., *A 1.8 μW 60 nV/√Hz Capacitively-Coupled Chopper Instrumentation Amplifier in 65 nm CMOS for Wireless Sensor Nodes*, IEEE Journal of Solid-State Circuits, vol. 46, No. 7 (Jul. 2011), 10 pages.

Kwan et al., *An Adaptive Analog Continuous-Time CMOS Biquadratic Filter*, IEEE Custom Integrated Circuits Conference (1991), 4 pages.

Gregoire, Robert, *An Over-60 dB True Rail-to-Rail Performance Using Correlated Level Shifting and Opamp With Only 30 DB Loop Gain*, IEEE International Solid-State Circuits Conference (2008), 3 pages.

Yazicioglu R.F. et al., *A 60 μW 60nV/√Hz Readout Front-End for Portable Biopotential Acquisition Systems*, IEEE Journal of Solid-State Circuits, vol. 42, No. 5 (May 2007), 11 pages.

van den Dool et al., *Indirect Current-Feedback Instrumentation Amplifier With a Common-Mode Input Range that Includes the Negative Rail*, IEEE Journal of Solid-State Circuits, vol. 28, No. 7 (Jul. 1993), 7 pages.

Kitchin et al., *A Designer's Guide to Instrumentation Amplifiers*, 3rd Edition (2006), 130 pages (available at World Wide Web page: analog.com/en/specialty-amplifiers/current-sense-amplifiers/products/design-handbooks/cu_dh_designers_guide_to_instrumentation_amps/resources/fca.html).

Song et al., *A Robust Rail-to-Rail Input Stage with Constant-$g_m$ and Constant Slew Rate Using a Novel Level Shifter*, IEEE International Symposium on Circuits and Systems (2007), 4 pages.

Wang et al., *Low-Power Instrumental Amplifier for Portable ECG*, IEEE Circuits and Systems International Conference on Testing and Diagnostics (2009), 4 pages.

International Search Report and Written Opinion of the International Searching Authority in PCT Appl. No. PCT/US2012/048297, dated Nov. 5, 2012, 15 pages.

\* cited by examiner

APPARATUS AND METHODS FOR ADAPTIVE COMMON-MODE LEVEL SHIFTING

CROSS-REFERENCE TO RELATED APPLICATIONS

This application is related to U.S. application Ser. No. 13/233,829, entitled APPARATUS AND METHODS FOR ELECTRONIC AMPLIFICATION (Inventor: Evgueni Ivanov; filed on even date herewith), the disclosure of which is incorporated herein by reference in its entirety.

BACKGROUND

1. Field

Embodiments of the invention relate to electronic devices, and more particularly, to level shifters.

2. Description of the Related Technology

An amplifier, such as an operational amplifier or an instrumentation amplifier, can include an adaptive level shifter. For example, the adaptive level shifter can be used to shift a common-mode voltage of a differential input signal received by the amplifier to a common-mode voltage level more suitable for amplifying the input signal.

Including an adaptive level shifter in an amplifier can improve the performance of the amplifier. For example, the adaptive level shifter can have an input voltage operating range that is greater than an input voltage operating range of an amplification block of the amplifier, and thus including the adaptive level shifter can help prevent the input voltage operating range of the amplification block from limiting the overall input voltage operating range of the amplifier.

There is a need for adaptive level shifters having improved performance. Additionally, there is need for adaptive level shifters having large input voltage operating range, high common-mode rejection, low power consumption, and low noise.

SUMMARY

In one embodiment, an apparatus includes a level shifter having a first input, a second input, a first output, and a second output, the first and second inputs configured to receive a differential input voltage signal and the first and second outputs configured to provide a differential output voltage signal. The level shifter includes a plurality of capacitors including a first capacitor and a second capacitor and a plurality of switches electrically coupled to the plurality of capacitors. The level shifter is configured to control the electrical connectivity of the plurality of capacitors via the plurality of switches over at least a first phase, a second phase, a third phase, and a fourth phase. The level shifter further includes a charger block configured to charge the first and second capacitors during at least a portion of the third and fourth phases to a shift voltage about equal to a difference in voltage between a common mode voltage level of the differential input voltage signal and a reference voltage. The plurality of switches are configured to electrically connect the first capacitor between the first input and first output during the first phase and between the second input and the second output during the second phase. The plurality of switches are further configured to electrically connect the second capacitor between the second input and second output during the first phase and between the first input and the first output during the second phase.

In another embodiment an apparatus includes a level shifter having a first input, a second input, a first output, and a second output, the first and second inputs configured to receive a differential input voltage signal and the first and second outputs configured to provide a differential output voltage signal. The level shifter includes a switch control module, a plurality of capacitors including a first capacitor and a second capacitor, and a plurality of switches electrically coupled to the plurality of capacitors. The switch control module is configured to control the electrical connectivity of the plurality of capacitors via the plurality of switches over at least a first phase, a second phase, a third phase, and a fourth phase. The level shifter further includes a means for charging configured to charge the first and second capacitors during at least a portion of the third and fourth phases to a shift voltage about equal to a difference in voltage between a common mode voltage level of the differential input voltage signal and a reference voltage. The switch control module is configured to electrically connect the first capacitor between the first input and first output during the first phase and between the second input and the second output during the second phase via the plurality of switches. The switch control module is further configured to electrically connect the second capacitor between the second input and second output during the first phase and between the first input and the first output during the second phase via the plurality of switches.

In another embodiment, a method of level shifting includes receiving a differential input voltage signal between a first input and a second input of a level shifter, and charging each of a first capacitor and a second capacitor to a voltage that is about equal to a difference between a common mode voltage of the differential input voltage signal and a reference voltage. The method further includes electrically connecting the first capacitor between the first input and a first output of the level shifter during a first phase of the level shifter and the second capacitor between the second input and a second output of the level shifter during the first phase. The method further includes switching connections for the first capacitor and the second capacitor such that the first capacitor is electrically connected between the second input and the second output during a second phase of the level shifter and the second capacitor is electrically connected between the first input and the first output during the second phase.

DETAILED DESCRIPTION OF EMBODIMENTS

Figure 1:
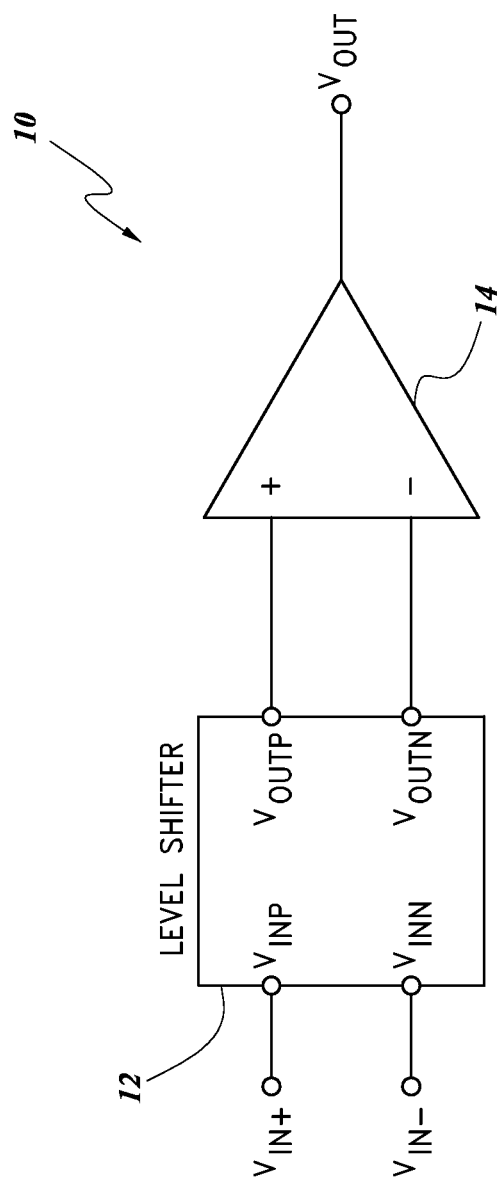
FIG. 1 is a schematic block diagram illustrating one example of an amplifier.

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

FIG. 1 is a schematic block diagram of one example of an amplifier 10. The amplifier 10 includes an adaptive level shifter 12, and an amplification block 14. The amplifier 10 can be, for example, an operational amplifier or an instrumentation amplifier.

The amplifier 10 includes a positive or non-inverted input terminal $\mathrm{\backslash T_{IN+}}$, a negative or inverted input terminal $V_{IN-}$, and an output terminal $V_{OUT}$. The adaptive level shifter includes a first input $V_{INP}$, a second input $V_{INN}$, a first output $V_{OUTP}$, and a second output $V_{OUTN}$. The amplification block 14 includes a non-inverted input, an inverted input, and an output.

The first and second inputs $V_{INP}$, $V_{INN}$ of the adaptive level shifter 12 are electrically connected to the non-inverted and inverted input terminals $V_{IN+}$, $V_{IN-}$ of the amplifier 10, respectively. The first and second outputs $V_{OUTP}$, $V_{OUTN}$ of the adaptive level shifter 12 are electrically connected to the non-inverted and inverted inputs of the amplification block 14, respectively. The output of the amplification block 14 is electrically connected to the output terminal $V_{OUT}$ of the amplifier 10.

The amplifier 10 can be used to amplify a voltage difference between the non-inverted and inverted input terminals $V_{IN+}$, $V_{IN-}$ to generate an amplified output voltage signal on the output terminal $V_{OUT}$. Although the amplifier 10 is illustrated as including a single-ended voltage output, in certain implementations, the amplifier 10 can be configured to generate a differential output voltage.

As will be described in detail further below, the adaptive level shifter 12 can be used to shift the common-mode voltage level of a differential input voltage signal received between the first and second voltage inputs $V_{INP}$, $V_{INN}$. For example, in some implementations the adaptive level shifter 12 can be configured to generate a differential output voltage signal between the first and second voltage outputs $V_{OUTP}$, $V_{OUTN}$ that has about the same differential signal magnitude as the differential input voltage signal received between the first and second voltage inputs $V_{INP}$, $V_{INN}$. However, the common-mode level of the first and second voltage outputs $V_{OUTP}$, $V_{OUTN}$ can be shifted relative to the common-mode voltage level of the first and second voltage inputs $V_{INP}$, $V_{INN}$.

The amplification block 14 can include one or more amplification stages configured to achieve a desired overall performance of the amplifier 10. For example, in some configurations, the amplification block 14 can include one or more amplification stages cascaded to obtain a desired overall gain. In some implementations, the amplification block 14 can also include an output stage for controlling the output resistance of the amplifier 10. The amplification block 14 can include any suitable amplification stages, including, for example, voltage amplification stages, current amplification stages, transconductance amplification stages and/or transimpedance amplification stages.

The adaptive level shifter 12 can be used to improve the overall performance of the amplifier 10. For example, the adaptive level shifter 12 can be configured to have an input voltage operating range that is greater than an input voltage operating range of the amplification block 14. Accordingly, including the adaptive level shifter 12 at the inputs of the amplifier 10 can aid in preventing the input voltage operating range of the amplification block 14 from limiting the overall input voltage operating range of the amplifier 10.

The adaptive level shifter 12 can also advantageously aid in improving the common-mode rejection ratio (CMRR) of the amplifier 10. In some implementations, the adaptive level shifter 12 can increase the overall CMRR of the amplifier 10 by a factor about equal to the CMRR of the adaptive level shifter 12. For example, in some configurations the overall CMRR of the amplifier 10 can be about equal to $CMRR_{12}*CMRR_{14}$, where $CMRR_{12}$ is the CMRR of the adaptive level shifter 12 and $CMRR_{14}$ is the CMRR of the amplification block 14. Accordingly, including the adaptive level shifter 12 in the amplifier 10 can improve the overall CMRR of the amplifier, thereby relaxing design constraints associated with the amplification block 14 and/or avoiding a need to employ more complicated or expensive CMRR improvement schemes in the amplifier 10, such as those associated with trimming precision resistors.

In some implementations, the adaptive level shifter 12 can improve the performance of the amplifier 10 by shifting the common-mode voltage of a differential input voltage signal received on the non-inverted and inverted input terminals $V_{IN+}$, $V_{IN-}$ to a common-mode voltage level that allows the amplification block 14 to use low operating voltage transistors that have a relatively high gain and small size, but also a relatively low breakdown voltage. For example, the adaptive level shifter 12 can be used to control the common-mode voltage level at the inputs of the amplification block 14 to a voltage level associated with relatively low gate-source and/or drain-source voltage biasing conditions of the input transistors of the amplification block 14. Accordingly, the adaptive level shifter 12 can permit the input transistors of the amplification block 14 to be low operating voltage transistors, thereby improving the gain, linearity, power consumption and/or other performance characteristics of the amplifier 10 for a given amount of circuit area.

The noise performance of the adaptive level shifter 12 can have a relatively large impact on the performance of the amplifier 10. For example, since the first and second outputs $V_{OUTP}$, $V_{OUTN}$ of the adaptive level shifter 12 are electrically connected to the non-inverted and inverted inputs of the amplification block 14, respectively, noise components at the first and second outputs $V_{OUTP}$, $V_{OUTN}$ of the adaptive level shifter 12 can be amplified by the amplification block 14 and contribute to the overall noise of the amplifier 10.

Although the adaptive level shifter 12 has been illustrated in the context of the amplifier 10 of FIG. 1, one or more adaptive level shifters can be used in a wide array of ICs and other electronics configured to amplify electronic signals. Accordingly, the adaptive level shifters described herein can be used in amplifiers having different circuit topologies.

FIGS. 2A-2D are circuit diagrams illustrating various phases of one embodiment of an adaptive level shifter 20. The adaptive level shifter 20 includes a first capacitor 1a, a second capacitor 1b, a third capacitor 2a, a fourth capacitor 2b, first to eighth switching components 18a-18h, and a charger block 16. The first and second capacitors 1a, 1b can be referred to herein as a first pair of capacitors, and the third and fourth capacitors 2a, 2b can be referred to herein as a second pair of capacitors.

The adaptive level shifter 20 further includes a first voltage input $V_{INP}$, a second voltage input $V_{INN}$, a first voltage output $V_{OUTP}$, and a second voltage output $V_{OUTN}$. The first and second voltage outputs $V_{OUTP}$, $V_{OUTN}$ are electrically connected to the second and fourth switching components 18b, 18d, respectively. The first and second voltage inputs $V_{INP}$, $V_{INN}$ are electrically connected to the first and third switching components 18a, 18c, respectively. The charger block 16 is electrically connected to the fifth to eighth switching components 18e-18h, and is configured to receive the voltage reference $V_{REF}$. The first to eighth switching components 18a-18h are electrically coupled to the first pair of capacitors 1a, 1b and to the second pair of capacitors 2a, 2b, and can be used to control the electrical connectivity of the capacitors over various phases of the adaptive level shifter 20.

The adaptive level shifter 20 can be used to shift a common-mode voltage level of a differential input voltage signal received between the first and second voltage inputs $V_{INP}$, $V_{INN}$ to a common-mode voltage level about equal to the reference voltage $V_{REF}$. For example, as will be described below, the adaptive level shifter 20 can be configured to generate a voltage on the first voltage output $V_{OUTP}$ that is about equal to $(V_{INP}-V_{SAT})$ and a voltage on the second voltage output $V_{OUTN}$ that is about equal to $(V_{INN}-V_{SHIFT})$, where $V_{SHIFT}$ is about equal to the difference between the common-mode input voltage $(V_{INP}+V_{INN})/2$ and the reference voltage $V_{REF}$.

One example of the electrical connectivity of the adaptive level shifter 20 during a first phase, a second phase, a third phase, and a fourth phase is shown in FIGS. 2A-2D, respectively.

Figure 2A:
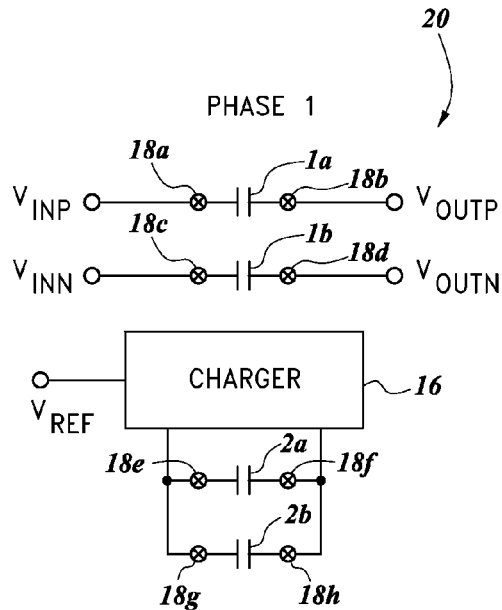
FIGS. 2A-2D are circuit diagrams illustrating various phases of one embodiment of an adaptive level shifter.
Figure 2B:
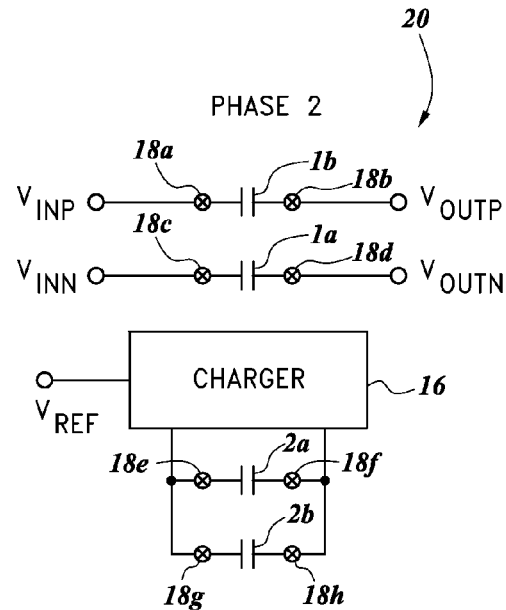

As shown in FIG. 2A, during the first phase the switching components 18a-18h can be configured to electrically connect the first capacitor 1a between the first voltage input $V_{INP}$ and the first voltage output $V_{OUTP}$, to electrically connect the second capacitor 1b between the second voltage input $V_{INN}$ and the second voltage output $V_{OUTN}$, and to electrically connect the second pair of capacitors 2a, 2b to the charger block 16. Additionally, as shown in FIG. 2B, during the second phase of the adaptive level shifter 20, the switching components 18a-18h can be configured to electrically connect the first capacitor 1a between the second voltage input $V_{INN}$ and the second voltage output $V_{OUTN}$, to electrically connect the second capacitor 1b between the first voltage input $V_{INP}$ and the first voltage output $V_{OUTP}$, and to electrically connect the second pair of capacitors 2a, 2b to the charger block 16.

Figure 2C:
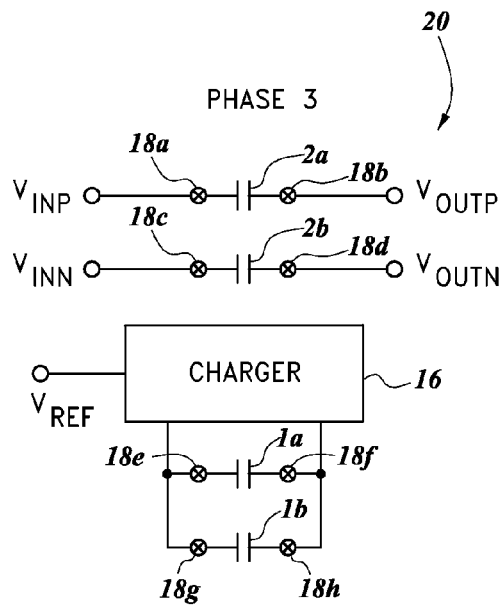
Figure 2D:
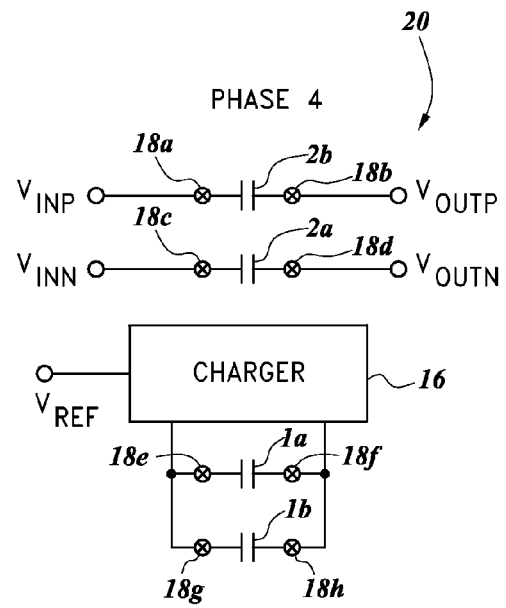

During the third phase of the adaptive level shifter 20 shown in FIG. 2C, the switching components 18a-18h can be configured to electrically connect the third capacitor 2a between the first voltage input $V_{INP}$ and the first voltage output $V_{OUTP}$, to electrically connect the fourth capacitor 2b between the second voltage input $V_{INN}$ and the second voltage output $V_{OUTN}$, and to electrically connect the first pair of capacitors 1a, 1b to the charger block 16. Additionally, as shown in FIG. 2D, during the fourth phase of the adaptive level shifter 20, the switching components 18a-18h can be configured to electrically connect the third capacitor 2a between the second voltage input $V_{INN}$ and the second voltage output $V_{OUTN}$, to electrically connect the fourth capacitor 2b between the first voltage input $V_{INP}$ and the first voltage output $V_{OUTP}$, and to electrically connect the first pair of capacitors 1a, 1b to the charger block 16.

The adaptive level shifter 20 can be configured to switch between the electrical connectivities associated with the first, second, third and fourth phases over time. For example, the adaptive level shifter 20 can be configured to switch from the connectivity of the first phase to the connectivity of the second phase, from the connectivity of the second phase to the connectivity of the third phase, from the connectivity of the third phase to the connectivity of the fourth phase, and from the connectivity of the fourth phase back to the connectivity of the first phase. The adaptive level shifter 20 can be configured to operate in each phase for any suitable period of time, including, for example, a time in the range of about 100 ns to about 100 ms for each phase. However, other time values will be readily determined by one of skill in the art. As skilled artisans will appreciate, the adaptive level shifter 20 need not remain in each phase for the same amount of time, and that the adaptive level shifter 20 can be configured to operate using more or fewer phases.

By switching the adaptive level shifter 20 between the first, second, third and fourth phases, the adaptive level shifter 20 can shift the common-mode voltage of a differential input voltage signal received between the first and second voltage inputs $V_{INP}$, $V_{INN}$ so as to generate a differential output voltage signal between the first and second voltage outputs $V_{OUTP}$, $V_{OUTN}$ having a common-mode voltage about equal to the reference voltage $V_{REF}$ and a differential voltage about equal to the differential input voltage between the first and second voltage inputs $V_{INP}$, $V_{INN}$. For example, the adaptive level shifter 20 can be configured to generate a voltage on the first voltage output $V_{OUTP}$ that is about equal to $(V_{INP}-V_{SHIFT})$ and a voltage on the second voltage output $V_{OUTN}$ that is about equal to $(V_{INN}-V_{SHIFT})$, where $V_{SHIFT}$ is equal to the difference between the common-mode input voltage $(V_{INP}+V_{INN})/2$ and the voltage of the reference voltage $V_{REF}$.

The charger block 16 can be used to charge one or more capacitors to a voltage about equal to the difference between the voltage of the reference voltage $V_{REF}$ and the common-mode voltage of the first and second voltage inputs $V_{INP}$, $V_{INN}$. For example, during the first and second phases of the adaptive level shifter 20 shown in FIGS. 2A and 2B, respectively, the charger block 16 can be configured to charge the voltage across each of the third and fourth capacitors 2a, 2b to a voltage $V_{SHIFT}$ about equal to the difference between the common-mode input voltage of the first and second voltage inputs $V_{INP}$, $V_{INN}$ and the reference voltage $V_{REF}$. Additionally, during the third and fourth phases of the adaptive level shifter 20 shown in FIGS. 2C and 2D, respectively, the charger block 16 can be configured to charge the voltage across each of the first and second capacitors 1a, 1b to be about equal to $V_{SHIFT}$.

The first to fourth switching components 18a-18d can be configured to insert the charged capacitors between the inputs and the outputs of the adaptive level shifter 20, thereby generating a differential output voltage signal that has a shifted common-mode voltage level. For example, the first pair of capacitors 1a, 1b can be inserted between the inputs and outputs of the adaptive level shifter 20 during the first and second phases, and the second pair of capacitors 2a, 2b can be inserted between the inputs and outputs of the adaptive level shifter 20 during the third and fourth phases. As shown in FIGS. 2A-2D, the capacitors can be regularly charged so as to maintain a voltage across each capacitor about equal to $V_{SHIFT}$. For example, the second pair of capacitors 2a, 2b can be charged during the first and second phases of the adaptive level shifter 20, and the first pair of capacitors 1a, 1b can be charged during the third and fourth phases of the adaptive level shifter 20.

When a capacitor is disconnected from the charger block 16, sampling noise can result in the voltage across the disconnected capacitor deviating from the shift voltage $V_{SHIFT}$. For example, when transitioning the adaptive level shifter 20 from the connectivity associated with the fourth phase to the connectivity associated with the first phase, a voltage sampling error can be generated across each of the first and second capacitors 1a, 1b when the capacitors are disconnected from the charger block 16. The sampling noise can contribute to the differential noise at the inputs of the amplifier 14, thereby degrading the overall noise performance of the amplifier 10.

To aid in reducing or eliminating the sampling noise, the first and second capacitors 1a, 1b can be effectively regularly swapped so as to cancel the sampling noise. For example, the first capacitor 1a can be electrically connected between first voltage input $V_{INP}$ and the first voltage output $V_{OUTP}$ during the first phase and between the second voltage input $V_{INN}$ and the second voltage output $V_{OUTN}$ during the second phase, while the second capacitor 1b can be electrically connected between the second voltage input $V_{INN}$ and the second voltage output $V_{OUTN}$ during the first phase and between the first voltage input $V_{INP}$ and the first voltage output $V_{OUTP}$ during the second phase. Similarly, the sampling noise associated with the third and fourth capacitors 2a, 2b can be reduced or eliminated by electrically connecting the third capacitor 2a between the first voltage input $V_{INP}$ and the first voltage output $V_{OUTP}$ during the third phase and between the second voltage input $V_{INN}$ and the second voltage output $V_{OUTN}$ during the fourth phase, and by electrically connecting the fourth capacitor 2b between the second voltage input $V_{INN}$ and the second voltage output $V_{OUTN}$ during the third phase and between the first voltage input $V_{INP}$ and the first voltage output $V_{OUTP}$ during the fourth phase.

In some implementations, each of the capacitors in the first pair of capacitors 1a, 1b and the second pair of capacitors 2a, 2b has a capacitance selected in the range of about 0.1 pF to about 1000 pF, for example, about 10 pF. However, other capacitance values will be readily determined by one of skill in the art.

The reference voltage $V_{REF}$ can be generated in any suitable manner. For example, in some implementations the reference voltage $V_{REF}$ can be generated using a voltage regulator or other suitable voltage generator disposed on an IC on which the adaptive level shifter 20 is disposed. However, in other implementations, the reference voltage $V_{REF}$ can be electrically connected to a pin or pad of an IC so as to allow an end-user, including, for example, a circuit board manufacturer, to control the voltage of the reference voltage $V_{REF}$.

FIGS. 3A-3D are circuit diagrams illustrating various phases of another embodiment of an adaptive level shifter 30. The adaptive level shifter 30 includes the first voltage input $V_{INP}$, the second voltage input $V_{INN}$, the first voltage output $V_{OUTP}$, the second voltage output $V_{OUTN}$, the first capacitor 1a, the second capacitor 1b, the third capacitor 2a, the fourth capacitor 2b, a fifth capacitor 3a, a sixth capacitor 3b, first to twelfth switching components 18a-18l, and the charger block 16. The fifth and sixth capacitors 3a, 3b can be referred to herein as a third pair of capacitors.

The adaptive level shifter 30 of FIGS. 3A-3D is similar to the adaptive level shifter 20 of FIGS. 2A-2D. However, in contrast to the adaptive level shifter 20 of FIGS. 2A-2D, the adaptive level shifter 30 of FIGS. 3A-3D further includes the ninth to twelfth switching components 18i-18l and the third pair of capacitors 3a, 3b. For example, the ninth switching component 18i is electrically connected to the first voltage input $V_{INP}$, the tenth switching component 18j is electrically connected to the first voltage output $V_{OUTP}$, the eleventh switching component 18k is electrically connected to the second voltage input $V_{INN}$, and the twelfth switching component 18l is electrically connected to the second voltage output $V_{OUTN}$.

Figure 3A:
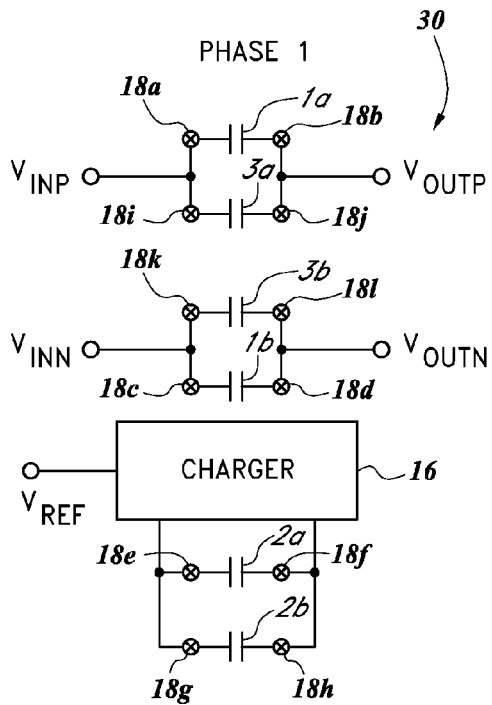
FIGS. 3A-3D are circuit diagrams illustrating various phases of another embodiment of an adaptive level shifter.
Figure 3B:
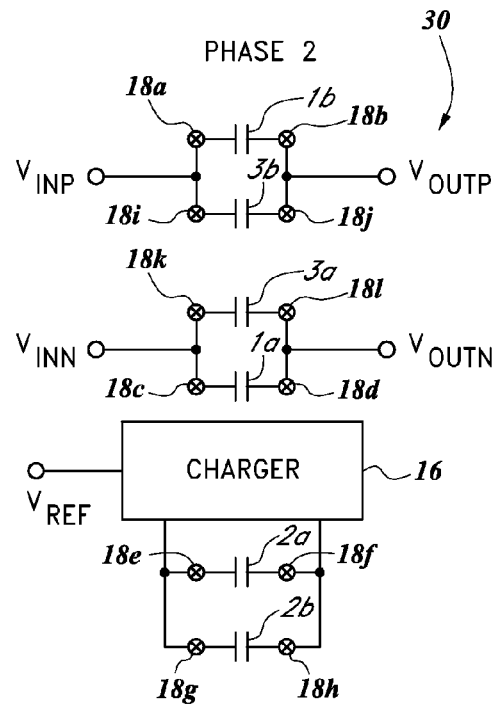
Figure 3C:
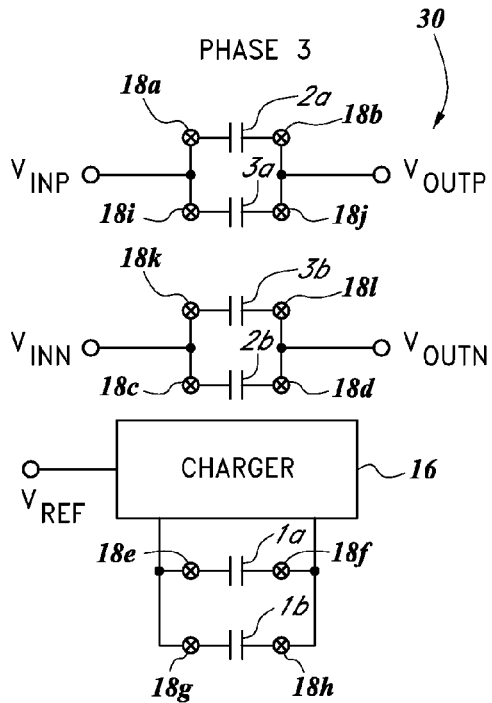
Figure 3D:
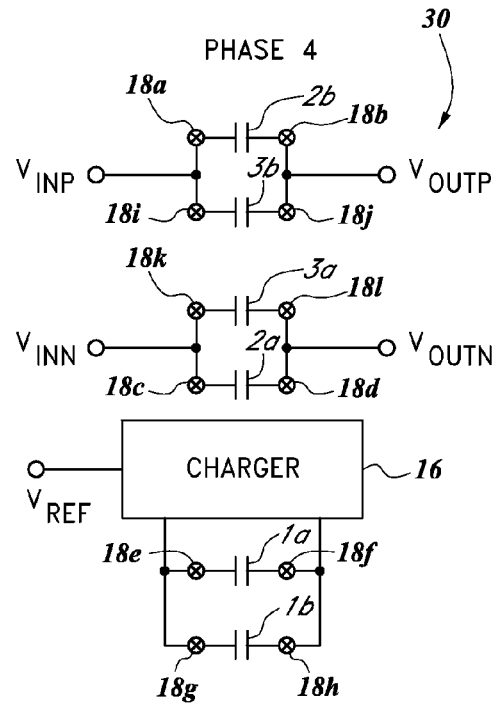

The ninth to twelfth switching components 18i-18l can be used to control the electrical connectivity of the third pair of capacitors 3a, 3b over various phases of the adaptive level shifter 30. For example, during the first and third phases shown in FIGS. 3A and 3C, respectively, the ninth to twelfth switching components 18i-18l can be configured to electrically connect the fifth capacitor 3a between the first voltage input $V_{INP}$ and the first voltage output $V_{OUTP}$ and to electrically connect the sixth capacitor 3b between the second voltage input $V_{INN}$ and the second voltage output $V_{OUTN}$. Additionally, as shown in FIGS. 3B and 3D, during the second and fourth phases of the adaptive level shifter 30, the ninth to twelfth switching components 18i-18l can be configured to electrically connect the fifth capacitor 3a between the second voltage input $V_{INN}$ and the second voltage output $V_{OUTN}$ and to electrically connect the sixth capacitor 3b between the first voltage input $V_{INP}$ and the first voltage output $V_{OUTP}$.

In some implementations, an adaptive level shifter is provided that includes one or more capacitors that are regularly switched between the first and second voltage inputs and the first and second voltage outputs, but that are not charged by the charger block 16.

The adaptive level shifter 30 can be used to shift a common-mode voltage level of a differential input voltage signal received between the first and second voltage inputs $V_{INP}$, $V_{INN}$ to a common-mode voltage level about equal to the reference voltage $V_{REF}$. For example, the adaptive level shifter 30 can be configured to generate a voltage on the first voltage output $V_{OUTP}$ that is about equal to $(V_{INP}-V_{SHIFT})$ and a voltage on the second voltage output $V_{OUTN}$ that is about equal to $(V_{INN}-V_{SHIFT})$, where $V_{SHIFT}$ is equal to the difference between the common-mode input voltage $(V_{INP}+V_{INN})/2$ and the reference voltage $V_{REF}$.

Although FIGS. 3A-3D illustrate one example of various phases of an adaptive level shifter that includes a third pair of capacitors 3a, 3b, other configurations are possible.

Figure 4A:
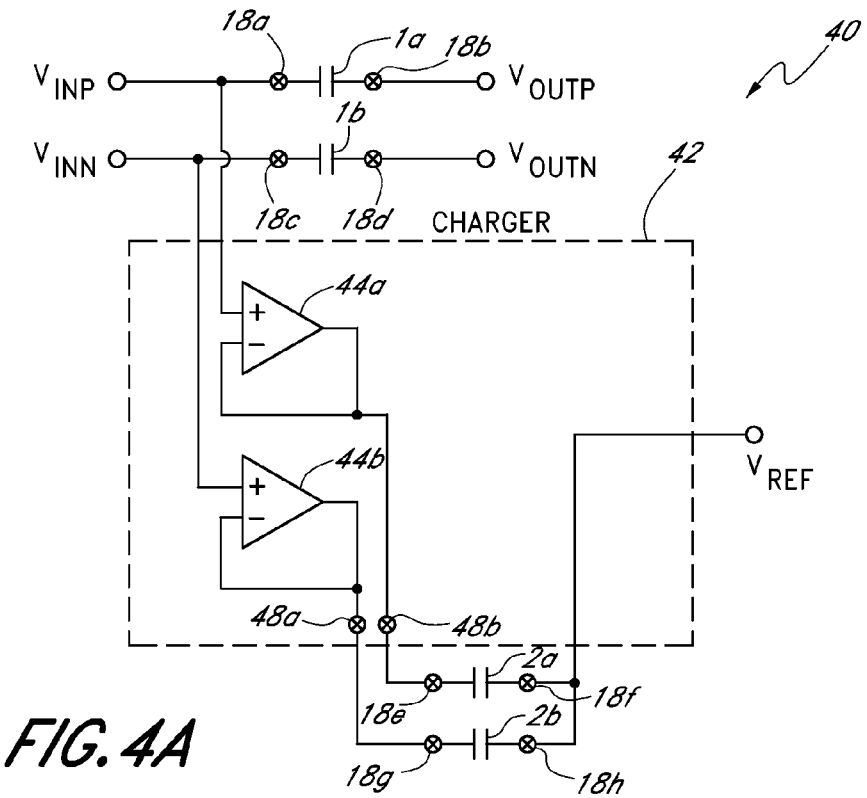
FIGS. 4A and 4B are circuit diagrams illustrating an adaptive level shifter including a charger block in accordance with one embodiment.
Figure 4B:
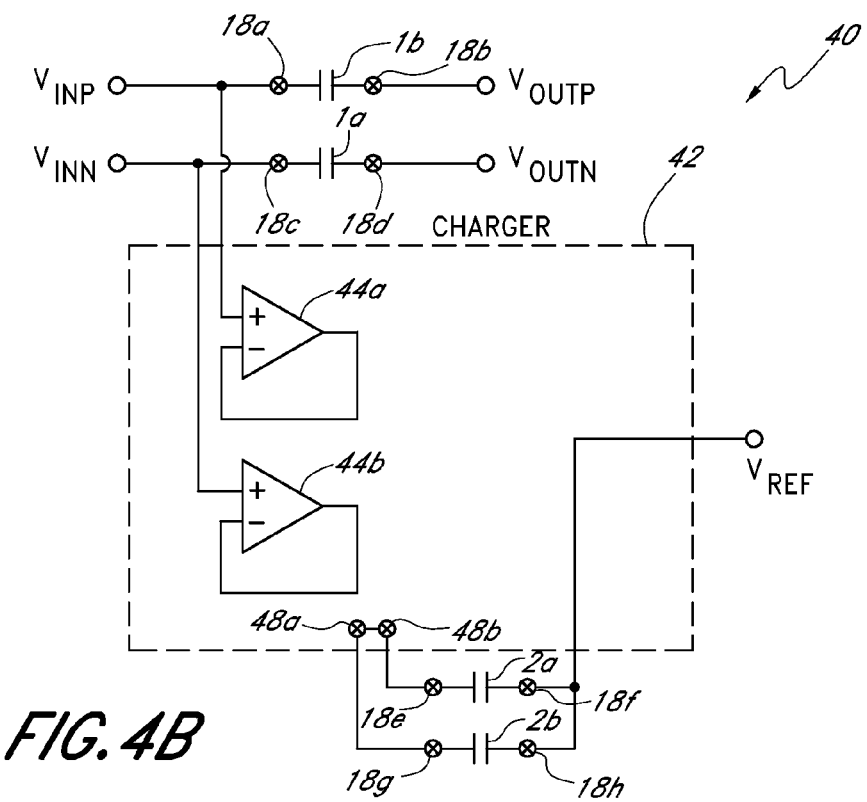

FIGS. 4A and 4B are circuit diagrams illustrating an adaptive level shifter 40 including a charger block 42 in accordance with one embodiment. The adaptive level shifter 40 includes the first voltage input $V_{INP}$, the second voltage input $V_{INN}$, the first voltage output $V_{OUTP}$, the second voltage output $V_{OUTN}$, the first to eighth switching components 18a-18h, the first pair of capacitors 1a, 1b, the second pair of capacitors 2a, 2b, and the charger block 42.

The charger block 42 includes a first amplification block 44a, a second amplification block 44b, a first switching component 48a, and a second switching component 48b. The first and second amplification blocks 44a, 44b each include a non-inverted input, an inverted input and an output. The non-inverted inputs of the first and second amplification blocks 44a, 44b are electrically connected to the first and second voltage inputs $V_{INP}$, $V_{INN}$ of the adaptive level shifter 40, respectively. The inverted input of the first amplification block 44a is electrically connected to the output of the first amplification block 44a, and the inverted input of the second amplification block 44b is electrically connected to the output of the second amplification block 44b.

The first and second amplification blocks 44a, 44b are electrically connected in a feedback configuration. For example, the outputs of the first and second amplification blocks 44a, 44b are electrically connected to the inverted inputs of the first and second amplification blocks 44a, 44b, respectively. By electrically connecting the first and second amplification blocks 44a, 44b in this manner, the outputs of the first and second amplification blocks 44a, 44b can be configured to generate a voltage about equal to the voltage of the first and second voltage inputs $V_{INP}$, $V_{INN}$, respectively.

The charger block 42 can be used to charge the first pair of capacitors 1a, 1b and the second pair of capacitors 2a, 2b over various phases of the adaptive level shifter 40. For example, FIGS. 4A and 4B illustrate the electrical connectivity of the adaptive level shifter 40 and of the charger block 42 during a first phase and during a second phase of the adaptive level shifter 40, respectively.

As shown in FIG. 4A, during the first phase of the adaptive level shifter 40, the first and second switching components 48a, 48b of the charger block 42 can be configured to electrically connect the outputs of the first and second amplification blocks 44a, 44b to a first end of the third and fourth capacitors 2a, 2b, respectively. Additionally, as shown in FIG. 4A, the second ends of the third and fourth capacitors 2a, 2b can be electrically connected to the reference voltage $V_{REF}$ during the first phase. During the second phase of the adaptive level shifter 40 shown in FIG. 2B, the first and second switching components 48a, 48b of the charger block 42 can be configured to electrically connect the first ends of the third and fourth capacitors 2a, 2b together, and the second ends of the third and fourth capacitors 2a, 2b can be electrically connected to the reference voltage $V_{REF}$.

By switching the charger block 42 between the configurations illustrated in FIGS. 4A and 4B, the charger block 42 can charge a voltage about equal to $V_{SHIFT}$ on the second pair of capacitors 2a, 2b. For example, during the first phase of the adaptive level shifter 40 shown in FIG. 4A, a first end of the third capacitor 2a can be charged to a voltage about equal to the voltage of the first voltage input $V_{INP}$, and a first end of the fourth capacitor 2b can be charged to a voltage about equal to the voltage of the second voltage input $V_{INN}$. Additionally, during the second phase of the adaptive level shifter 40 shown in FIG. 4B, the first ends of the third and fourth capacitors 2a, 2b can be electrically connected together such that a voltage of the first ends of the third and fourth capacitors 2a, 2b is about equal to the common-mode input voltage ($V_{INP}$+$V_{INN}$)/2 of the first and second voltage inputs $V_{INP}$, $V_{INN}$. Since the second ends of the third and fourth capacitors 2a, 2b can be charged to a voltage about equal to the reference voltage $V_{REF}$ during the first and second phases, the charger block 42 can be used to charge a voltage across the second pair of capacitors 2a, 2b about equal to $V_{SHIFT}$, where $V_{SHIFT}$ is the difference between the common-mode input voltage ($V_{INP}$+$V_{INN}$)/2 and the voltage of the reference voltage $V_{REF}$.

The charger block 42 can be configured to charge a voltage about equal to $V_{SHIFT}$ on the first pair of capacitors 1a, 1b during a third phase and a fourth phase of the adaptive level shifter 40. For example, with reference to FIGS. 2A-2D and 4A-4B, the first pair of capacitors 1a, 1b can be electrically connected to the charger block 42 during the third and fourth phases of the adaptive level shifter 40, and the charger block 42 can charge the first pair of capacitors 1a, 1b by switching to the connectivity shown in FIG. 4A during a third phase of the adaptive level shifter 40 and to the connectivity shown in FIG. 4B during a fourth phase of the adaptive level shifter 40.

Including the first and second amplification blocks 44a, 44b can aid in reducing the input offset current of the adaptive level shifter 40 relative to a design omitting the first and second amplification blocks 44a, 44b. For example, the first and second amplification blocks 44a, 44b can be configured to have a relatively high input impedance, and thus electrically connecting the first and second voltage inputs $V_{INP}$, $V_{INN}$ of the adaptive level shifter 40 to the non-inverted inputs of the first and second amplification blocks 44a, 44b can aid in reducing an input offset current of the adaptive level shifter 40 associated with charging and/or discharging the first pair of capacitors 1a, 1b and the second pairs of capacitors 2a, 2b.

Figure 5A:
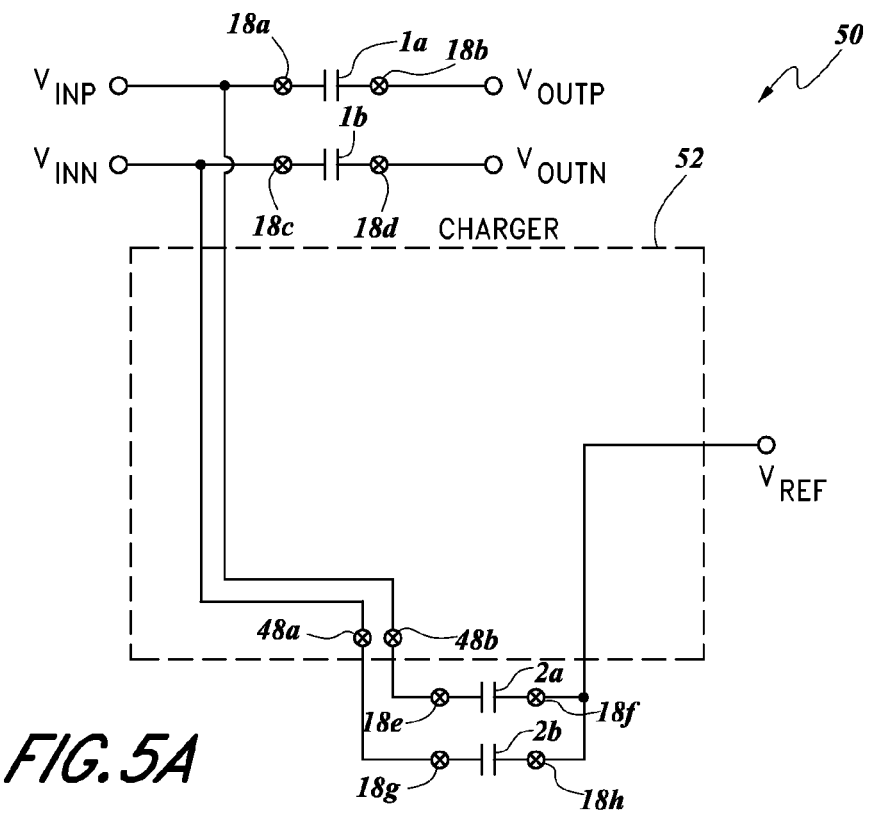
FIGS. 5A and 5B are circuit diagrams illustrating an adaptive level shifter including a charger block in accordance with another embodiment.
Figure 5B:
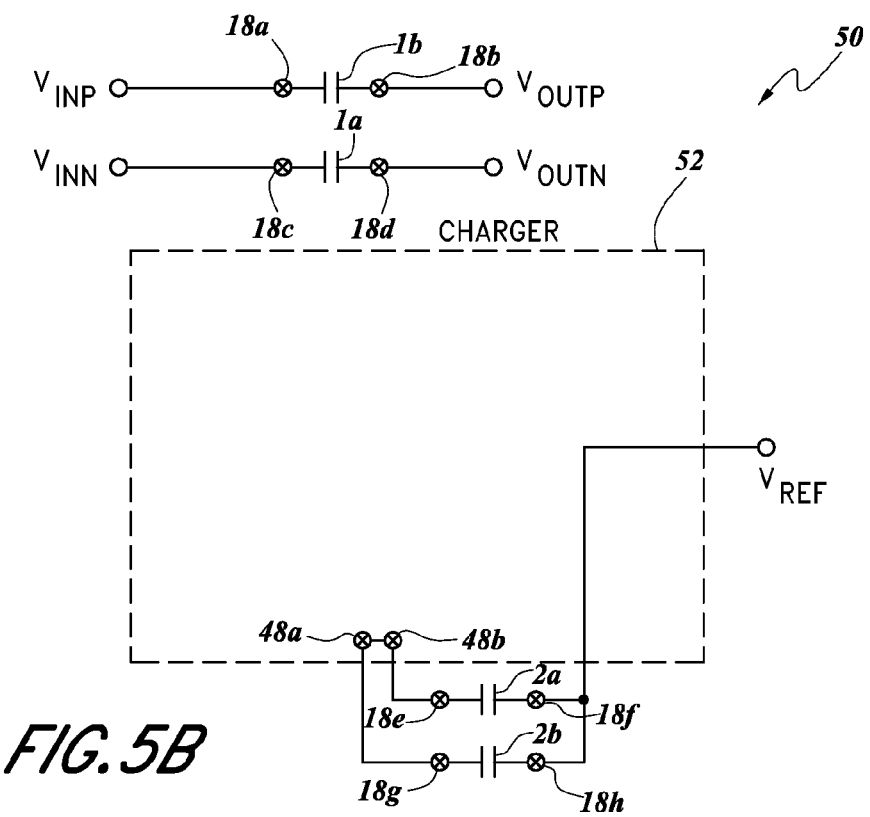

FIGS. 5A and 5B are circuit diagrams illustrating an adaptive level shifter 50 including a charger block 52 in accordance with another embodiment. The adaptive level shifter 50 includes the first voltage input $V_{INP}$, the second voltage input $V_{INN}$, the first voltage output $V_{OUTP}$, the second voltage output $V_{OUTN}$, the first to eighth switching components 18a-18h, the first pair of capacitors 1a, 1b, the second pair of capacitors 2a, 2b, and the charger block 52. The charger block 52 includes the first and second switching components 48a, 48b.

The adaptive level shifter 50 of FIGS. 5A and 5B is similar to the adaptive level shifter 40 of FIGS. 4A and 4B. However, in contrast to the charger block 42 of the adaptive level shifter 40 of FIGS. 4A and 4B, the charger block 52 of the adaptive level shifter 50 of FIGS. 5A and 5B does not include the first and second amplification blocks 44a, 44b. Rather, the charger block 52 of FIGS. 5A and 5B is configured to use the first and second switching components 48a, 48b to electrically connect the first and second voltage inputs $V_{INP}$, $V_{INN}$ to the first ends of the third and fourth capacitors 2a, 2b during the first phase of the adaptive level shifter 50, and to use the first and second switching components 48a, 48b to electrically connect the first ends of the third and fourth capacitors 2a, 2b together during the second phase of the adaptive level shifter 50.

By switching the charger block 52 between the configurations illustrated in FIGS. 5A and 5B, the charger block 52 can charge a voltage about equal to $V_{SHIFT}$ on the second pair of capacitors 2a, 2b. The charger block 52 can also be configured to charge a voltage about equal to $V_{SHIFT}$ on the first pair of capacitors 1a, 1b during a third phase and a fourth phase of the adaptive level shifter 50. For example, with reference to FIGS. 2A-2D and 5A-5B, the first pair of capacitors 1a, 1b can be electrically connected to the charger block 52 during the third and fourth phases of the adaptive level shifter 50, and the charger block 52 can charge the first pair of capacitors 1a, 1b by switching to the connectivity shown in FIG. 5A during a third phase of the adaptive level shifter 50 and to the connectivity shown in FIG. 5B during a fourth phase of the adaptive level shifter 50.

By omitting the first and second amplification blocks 44a, 44b from the charger block 52, the complexity of the charger block 52 can be reduced. However, the charger block 52 of FIGS. 5A and 5B can have an input offset current that is larger than an input offset current associated with the charger block 42 of FIGS. 4A and 4B. For example, the first and second voltage inputs $V_{INP}$, $V_{INN}$ can have an input offset current associated with charging and/or discharging the second pair of capacitors 2a, 2b during the first phase of the adaptive level shifter 50 and with charging and/or discharging the first pair of capacitors 1a, 1b during the third phase of the adaptive level shifter 50.

Figure 6:
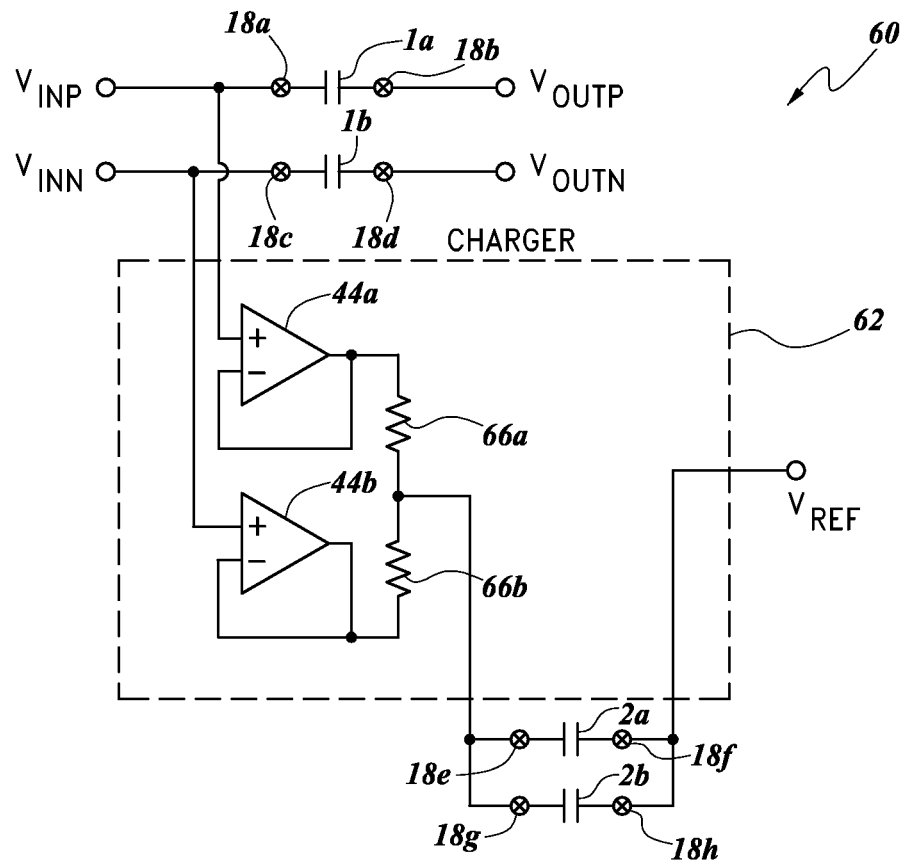
FIG. 6 is a circuit diagram illustrating an adaptive level shifter including a charger block in accordance with another embodiment.

FIG. 6 is a circuit diagram illustrating an adaptive level shifter 60 including a charger block 62 in accordance with another embodiment. The adaptive level shifter 60 includes the first voltage input $V_{INP}$, the second voltage input $V_{INN}$, the first voltage output $V_{OUTP}$, the second voltage output $V_{OUTN}$, the first to eighth switching components 18a-18h, the first pair of capacitors 1a, 1b, the second pair of capacitors 2a, 2b, and the charger block 62.

The charger block 62 includes the first and second amplification blocks 44a, 44b, a first resistor 66a, and a second resistor 66b. The first and second amplification blocks 44a,

44b each include a non-inverted input, an inverted input and an output. The non-inverted inputs of the first and second amplification blocks 44a, 44b are electrically connected to the first and second voltage inputs $V_{INP}$, $V_{INN}$ of the adaptive level shifter 60, respectively. The inverted input of the first amplification block 44a is electrically connected to the output of the first amplification block 44a and to a first end of the first resistor 66a. The inverted input of the second amplification block 44b is electrically connected to the output of the second amplification block 44b and to a first end of the second resistor 66b. The second resistor 66b further includes a second end electrically connected to a second end of the first resistor 66a.

The first and second amplification blocks 44a, 44b are electrically connected in a feedback configuration. For example, the outputs of the first and second amplification blocks 44a, 44b are electrically connected to the inverted inputs of the first and second amplification blocks 44a, 44b, respectively. By electrically connecting the first and second amplification blocks 44a, 44b in this manner, the outputs of the first and second amplification blocks 44a, 44b can be configured to generate a voltage about equal to a voltage of the first and second voltage inputs $V_{INP}$, $V_{INN}$, respectively. Additionally, the first and second resistors 66a, 66b can be selected to have a resistance that is about equal, thereby generating a voltage on the second ends of the first and second resistors 66a, 66b that is about equal to the common-mode input voltage $(V_{INP}+V_{INN})/2$ of the first and second voltage inputs $V_{INP}$, $V_{INN}$.

The charger block 62 can be used to charge the first pair of capacitors 1a, 1b and the second pair of capacitors 2a, 2b over various phases of the adaptive level shifter 60. For example, with reference to FIGS. 2A-2D and 6, the second pair of capacitors 2a, 2b can be electrically connected to the charger block 62 during the first and second phases of the adaptive level shifter 60, and the first pair of capacitors 1a, 1b can be electrically connected to the charger block 62 during the third and fourth phases of the adaptive level shifter 60. Additionally, the charger block 62 can be configured to charge a voltage about equal to $V_{SHIFT}$ across one or more capacitors electrically connected to the charger block 62, where $V_{SHIFT}$ is the difference between the common-mode input voltage $(V_{INP}+V_{INN})/2$ and the voltage of the reference voltage $V_{REF}$. For example, during the first phase of the adaptive level shifter 60, the charger block 62 can charge the first ends of the third and fourth capacitors 2a, 2b to a voltage about equal to the common-mode input voltage $(V_{INP}+V_{INN})/2$ and the second ends of the third and fourth capacitors 2a, 2b to a voltage about equal to the reference voltage $V_{REF}$, thereby charging a voltage across the second pair of capacitors 2a, 2b about equal to $V_{SHIFT}$.

Figure 7:
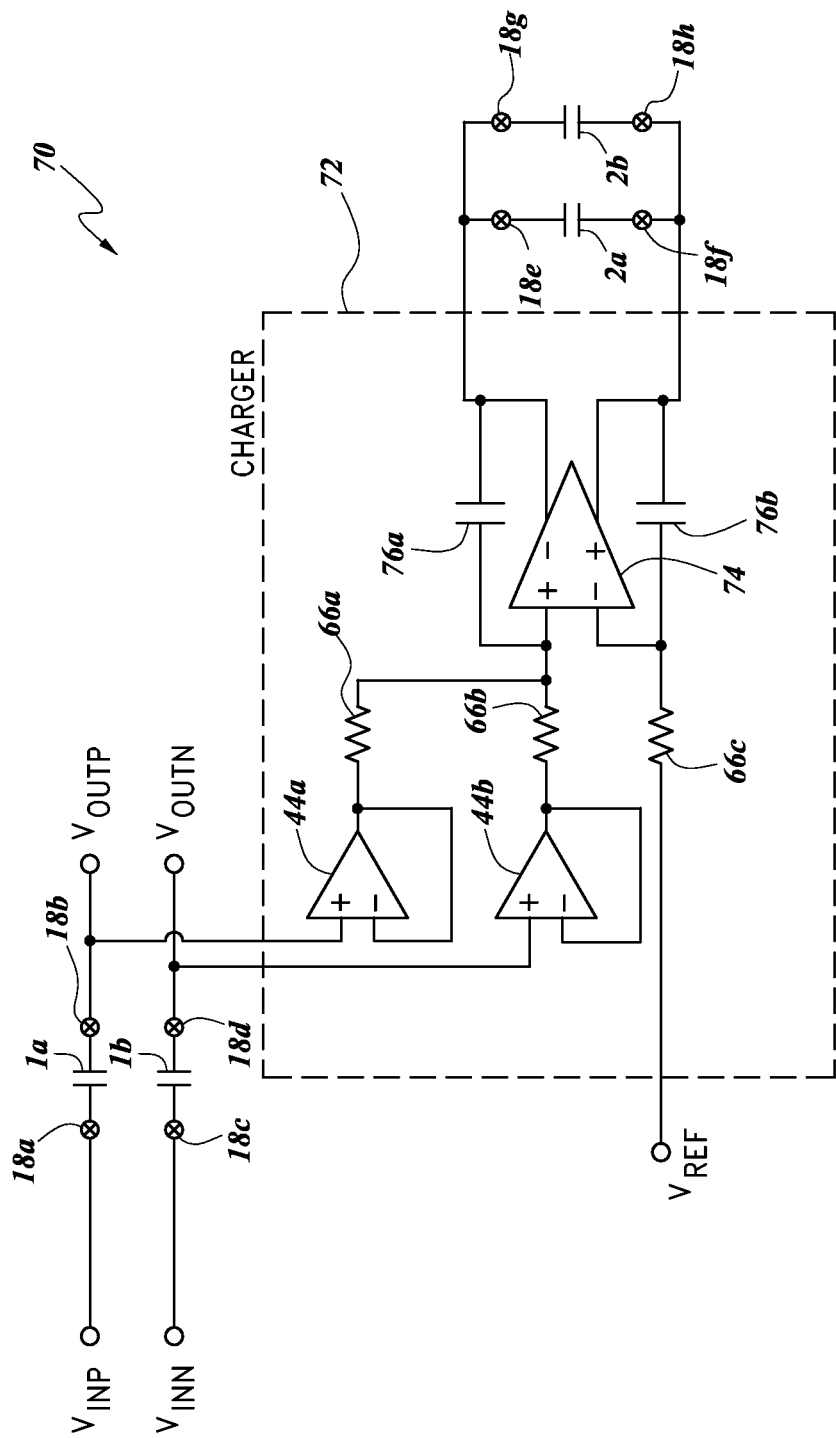
FIG. 7 is a circuit diagram illustrating an adaptive level shifter including a charger block in accordance with another embodiment.

FIG. 7 is a circuit diagram illustrating an adaptive level shifter 70 including a charger block 72 in accordance with another embodiment. The adaptive level shifter 70 includes the first voltage input $V_{INP}$, the second voltage input $V_{INN}$, the first voltage output $V_{OUTP}$, the second voltage output $V_{OUTN}$, the first to eighth switching components 18a-18h, the first pair of capacitors 1a, 1b, the second pair of capacitors 2a, 2b, and the charger block 72.

The charger block 72 includes the first and second amplification blocks 44a, 44b, the first and second resistors 66a, 66b, a third resistor 66c, a third amplification block 74, and first and second feedback capacitors 76a, 76b. The first and second amplification blocks 44a, 44b each include a non-inverted input, an inverted input and an output. The third amplification block 74 includes a non-inverted input, an inverted input, a non-inverted output, and an inverted output. The non-inverted inputs of the first and second amplification blocks 44a, 44b are electrically connected to the first and second voltage outputs $V_{OUTP}$, $V_{OUTN}$ of the adaptive level shifter 70, respectively. The inverted input of the first amplification block 44a is electrically connected to the output of the first amplification block 44a and to a first end of the first resistor 66a. The inverted input of the second amplification block 44b is electrically connected to the output of the second amplification block 44b and to a first end of the second resistor 66b. The second resistor 66b further includes a second end electrically connected to a second end of the first resistor 66a, to the non-inverted input of the third amplification block 74, and to a first end of the first feedback capacitor 76a. The first feedback capacitor 76a further includes a second end electrically connected to the inverted output of the third amplification block 74. The third resistor 66c includes a first end electrically connected to the voltage reference $V_{REF}$, and a second end electrically connected to the inverted input of the third amplification block 74 and to a first end of the second feedback capacitor 76b. The second feedback capacitor 76b further includes a second end electrically connected to the non-inverted output of the third amplification block 74.

The outputs of the first and second amplification blocks 44a, 44b can have a voltage about equal to a voltage of the first and second voltage outputs $V_{OUTP}$, $V_{OUTN}$, respectively. For example, the non-inverted inputs of the first and second amplification blocks 44a, 44b are electrically connected to the first and second voltage outputs $V_{OUTP}$, $V_{OUTN}$, and the first and second amplification blocks 44a, 44b are configured to be in a feedback configuration in which the outputs of the first and second amplification blocks 44a, 44b are electrically coupled to the inverted inputs of the first and second amplification blocks 44a, 44b, respectively. Additionally, the first and second resistors 66a, 66b can be selected to have about equal resistance, thereby generating a voltage at the non-inverted input of the third amplification block 74 that is about equal to the common-mode output voltage $(V_{OUTP}+V_{OUTN})/2$ of the first and second voltage outputs $V_{OUTP}$, $V_{OUTN}$.

The third amplification block 74 is electrically connected in a feedback configuration in which the first feedback capacitor 76a is electrically connected between the inverted output and the non-inverted input of the third amplification block 74 and the second feedback capacitor 76b is electrically connected between the non-inverted output and the inverted input of the third amplification block 74. Additionally, the inverted voltage input of the third amplification block 74 is electrically connected to the voltage reference $V_{REF}$ using the third resistor 66c, and the non-inverted voltage input of the third amplification block 74 is configured to receive a voltage about equal to the common-mode output voltage $(V_{OUTP}+V_{OUTN})/2$.

By electrically connecting the third amplification block 74 in this manner, the third amplification block 74 can control the common-mode voltage of the first and second voltage outputs $V_{OUTP}$, $V_{OUTN}$ of the adaptive level shifter 70 to be about equal to the reference voltage $V_{REF}$. For example, feedback of the third amplification block 74 can result in the voltage of the non-inverted input of the third amplification block 74 being about equal to the voltage of the inverted input of the third amplification block 74, which can occur when the common-mode output voltage $(V_{OUTP}+V_{OUTN})/2$ is about equal to the reference voltage $V_{REF}$.

The charger block 72 can be used to charge the first pair of capacitors 1a, 1b and the second pair of capacitors 2a, 2b over various phases of the adaptive level shifter 70. For example, with reference to FIGS. 2A-2D and 7, the second pair of capacitors 2a, 2b can be electrically connected between the non-inverted and inverted outputs of the third amplification block 74 of the charger block 72 during the first and second phases of the adaptive level shifter 70, and the first pair of capacitors 1a, 1b can be electrically connected between the non-inverted and inverted outputs of the third amplification block 74 of the charger block 72 during the third and fourth phases of the adaptive level shifter 70.

Including the charger block 72 in the adaptive level shifter 70 can improve the input voltage operating range of an amplifier using the adaptive level shifter 70. For example, in some implementations the first and second amplification blocks 44a, 44b may not operate or have poor performance at relatively high and/or relatively low input voltages. Since the illustrated charger block 72 is electrically connected to the first and second voltage outputs $V_{OUTP}$, $V_{OUTN}$ rather than to the first and second voltage inputs $V_{INP}$, $V_{INN}$ of the adaptive level shifter 70, the first and second amplification blocks 44a, 44b should not limit the overall input voltage operating range of the adaptive level shifter 70.

Figure 8A:
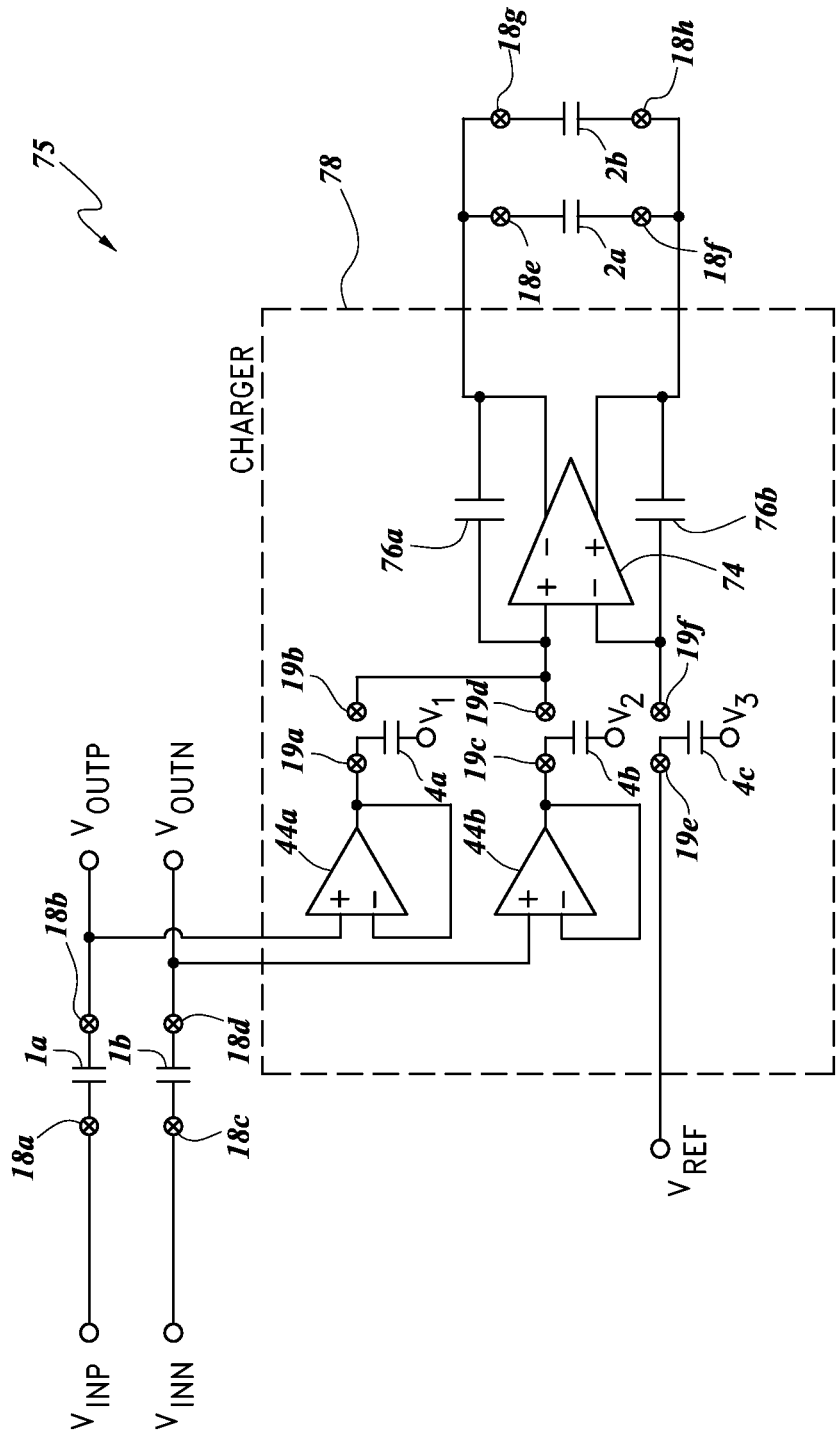
FIGS. 8A and 8B are circuit diagrams illustrating an adaptive level shifter including a charger block in accordance with another embodiment.
Figure 8B:
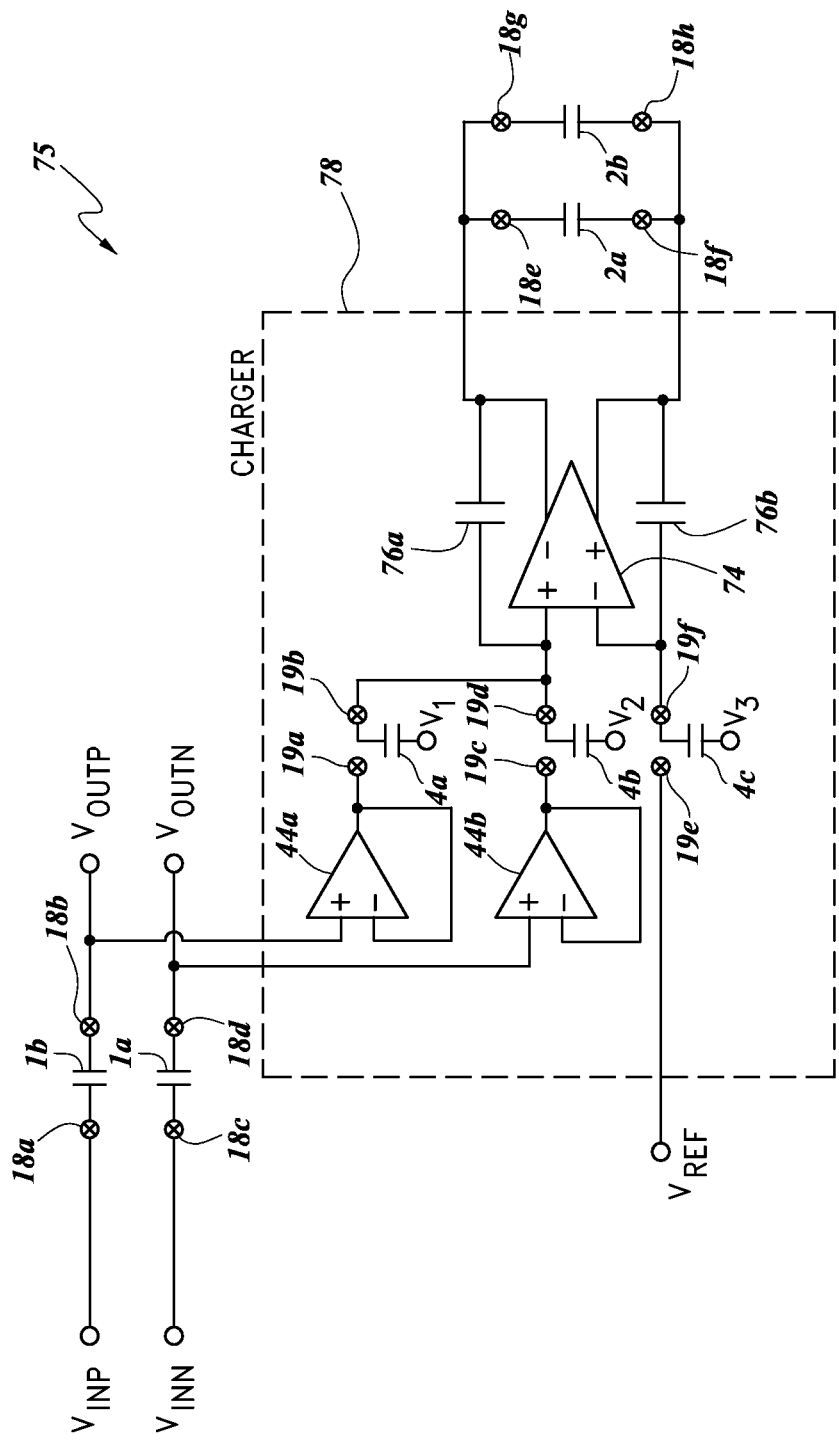

FIGS. 8A and 8B are circuit diagrams illustrating an adaptive level shifter 75 including a charger block 78 in accordance with another embodiment. The adaptive level shifter 75 includes the first voltage input $V_{INP}$, the second voltage input $V_{INN}$, the first voltage output $V_{OUTP}$, the second voltage output $V_{OUTN}$, the first to eighth switching components 18a-18h, the first pair of capacitors 1a, 1b, the second pair of capacitors 2a, 2b, and the charger block 78.

The charger block 78 includes the first amplification block 44a, the second amplification block 44b, the third amplification block 74, the first feedback capacitor 76a, the second feedback capacitor 76b, first to sixth switching components 19a-19f, and first to third capacitors 4a-4c. The non-inverted inputs of the first and second amplification blocks 44a, 44b are electrically connected to the first and second voltage outputs $V_{OUTP}$, $V_{OUTN}$ of the adaptive level shifter 75, respectively. The inverted input of the first amplification block 44a is electrically connected to the output of the first amplification block 44a and to the first switching component 19a. The inverted input of the second amplification block 44b is electrically connected to the output of the second amplification block 44b and to the third switching component 19c. The second and fourth switching components 19b, 19d are electrically connected to the non-inverted input of the third amplification block 74 and to the first end of the first feedback capacitor 76a. The second end of the first feedback capacitor 76a is electrically connected to the inverted output of the third amplification block 74. The fifth switching component 19e is electrically connected to the voltage reference $V_{REF}$. The sixth switching component 19f is electrically connected to the inverted input of the third amplification block 74 and to the first end of the second feedback capacitor 76b. The second end of the second feedback capacitor 76b is electrically connected to the non-inverted output of the third amplification block 74.

The outputs of the first and second amplification blocks 44a, 44b can have a voltage about equal to a voltage of the first and second voltage outputs $V_{OUTP}$, $V_{OUTN}$, respectively. For example, the non-inverted inputs of the first and second amplification blocks 44a, 44b are electrically connected to the first and second voltage outputs $V_{OUTP}$, $V_{OUTN}$, respectively, and the first and second amplification blocks 44a, 44b are configured to be in a feedback configuration in which the outputs of the first and second amplification blocks 44a, 44b are electrically coupled to the inverted inputs of the first and second amplification blocks 44a, 44b, respectively.

The charger block 78 can be used to charge the first pair of capacitors 1a, 1b and the second pair of capacitors 2a, 2b over various phases of the adaptive level shifter 75. For example, FIGS. 8A and 8B illustrate the electrical connectivity of the adaptive level shifter 75 and of the charger block 78 during a first phase and during a second phase of the adaptive level shifter 75, respectively. The connectivity of the charger block 78 shown in FIGS. 8A and 8B can be similar during a third phase and a fourth phase of the adaptive level shifter 75, respectively.

During the first and third phases of the adaptive level shifter 75, the first and third switching components 19a, 19c of the charger block 78 can be configured to electrically connect the outputs of the first and second amplification blocks 44a, 44b to first ends of the first and second capacitors 4a, 4b of the charger block 78, respectively. Additionally, the fifth switching component 19e of the charger block 78 can be configured to electrically connect a first end of the third capacitor 4c of the charger block 78 to the voltage reference $V_{REF}$. Furthermore, second ends of the first, second and third capacitors 4a-4c can be electrically connected to a first voltage $V_1$, a second voltage $V_2$, and a third voltage $V_3$, respectively. The first, second, and third voltages $V_1$-$V_3$ can have any suitable voltage level. For example, in some implementations, the first, second, and third voltages $V_1$-$V_3$ can each be electrically connected to a ground supply. During the second and fourth phases of the adaptive level shifter 75, the second and fourth switching components 19b, 19d of the charger block 78 can be configured to electrically connect the first ends of the first and second capacitors 4a, 4b of the charger block 78 together and to the non-inverted input of the third amplification block 74, and the sixth switching component 19f of the charger block 78 can be configured to electrically connect the inverted input of the third amplification block 74 to the reference voltage $V_{REF}$.

By switching the charger block 78 between the configurations illustrated in FIGS. 8A and 8B, the charger block 78 can charge a voltage about equal to $V_{SHIFT}$ on the second pair of capacitors 2a, 2b. For example, feedback of the third amplification block 74 can result in the voltage of the non-inverted input of the third amplification block 74 being about equal to the voltage of the inverted input of the third amplification block 74, which can occur when the common-mode output voltage $(V_{OUTP}+V_{OUTN})/2$ is about equal to the reference voltage $V_{REF}$.

The charger block 78 can be used to charge the first pair of capacitors 1a, 1b and the second pair of capacitors 2a, 2b over various phases of the adaptive level shifter 75. For example, with reference to FIGS. 2A-2D and 8A-8B, the second pair of capacitors 2a, 2b can be electrically connected between the non-inverted and inverted outputs of the third amplification block 74 of the charger block 78 during the first and second phases of the adaptive level shifter 75, and the first pair of capacitors 1a, 1b can be electrically connected between the non-inverted and inverted outputs of the third amplification block 74 of the charger block 78 during the third and fourth phases of the adaptive level shifter 75.

Including the charger block 78 in the adaptive level shifter 78 can improve the input voltage operating range of an amplifier using the adaptive level shifter 75. For example, in some implementations the first and second amplification blocks 44a, 44b may not operate or have poor performance at relatively high and/or relatively low input voltages. Since the illustrated charger block 78 is electrically connected to the first and second voltage outputs $V_{OUTP}$, $V_{OUTN}$ rather than to the first and second voltage inputs $V_{INP}$, $V_{INN}$ of the adaptive level shifter 75, the first and second amplification blocks 44a, 44b should not limit the overall input voltage operating range of the adaptive level shifter 75. Additionally, in contrast to the charger block 72 of FIG. 7, the charger block 78 of FIGS. 8A-8B need not include the first to third resistors 66a-66c. Accordingly, in some implementations, the adaptive level shifter 75 of FIGS. 8A-8B can have a relatively smaller circuit area that the adaptive level shifter 70 of FIG. 7.

Although FIGS. 8A and 8B illustrate one possible configuration of the charger block 78 during various phases of the adaptive level shifter 75, other configurations are possible. For example, the adaptive level shifter 75 can be modified so that the charger block 78 is in the configuration illustrated in FIG. 8A during the second and fourth phases of the adaptive level shifter 75, and so that the charger block 78 is in the configuration illustrated in FIG. 8B during the first and third phases of the adaptive level shifter 75. Furthermore, although FIGS. 8A-8B illustrate a configuration in which the charger block 78 includes six switching components 19a-19f and three capacitors 4a-4c, the adaptive level shifter 75 can be configured to include additional switching components and/or capacitors.

Figure 9:
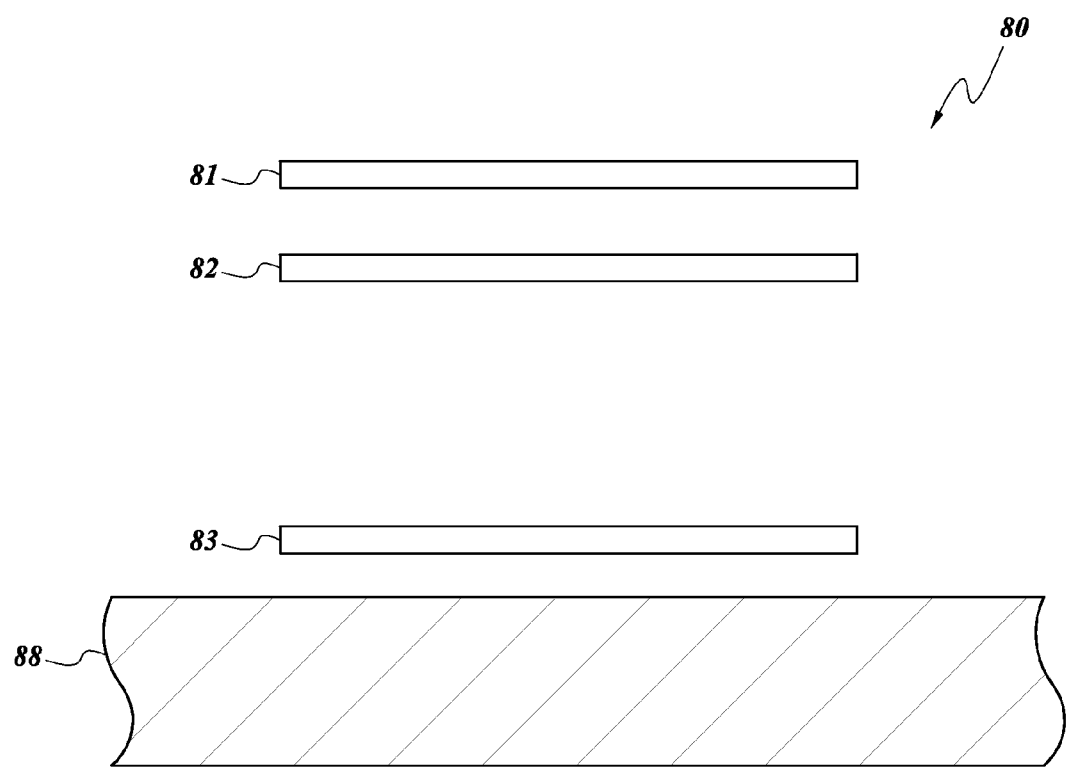
FIG. 9 is a cross-section of an integrated circuit including one example of a capacitor structure for use with an adaptive level shifter.

FIG. 9 is a cross-section of an integrated circuit (IC) 80 including one example of a capacitor structure for use with an adaptive level shifter. The illustrated IC includes a substrate 88 and first, second and third conductor portions 81-83. As shown in FIG. 9, the third conductor portion 83 is disposed over the substrate 88, the second conductor portion 82 is disposed over the third conductor portion 83, and the first conductor portion 81 is disposed over the second conductor portion 82.

The first and second conductor portions 81, 82 can operate as first and second plates or ends of a capacitor. For example, the first and second conductor portions 81, 82 can be formed from metal layers of the IC 80 and can operate in a metal-insulator-metal (MIM) capacitor structure. The first and second conductor portions 81, 82 can have an area selected to achieve a desired capacitance. For example, the first and second conductor portions can be formed from metal layers of the IC 80, and the area of overlap between the first and second conductor portions 81, 82 when viewed from above the substrate 88 can be selected to achieve a desired overall capacitance. Although the first and second conductor portions 81, 82 can be referred to as a first plate and a second plate of a capacitor, when the capacitor is inserted between an input and an output of a level shifter the capacitor can be orientated in any suitable manner. For example, in some implementations the first conductor portion 81 can be electrically connected to the input of the level shifter and the second conductor portion 82 can be electrically connected to the output of the level shifter, while in other implementations the second conductor portion 82 can be electrically connected to the input of the level shifter and the first conductor portion 81 can be electrically connected to the output of the level shifter.

In addition to a first plate and a second plate, a capacitor can include a back-plate associated with parasitic capacitance of the capacitor. For example, when using the first and second conductor portions 81, 82 as first and second plates of a capacitor, the first and/or second conductor portions 81, 82 can have a parasitic capacitance to other structures of the IC 80. For instance, in the illustrated configuration there can be a parasitic capacitance between the second conductor portion 82 and the third conductor portion 83. Furthermore, even in implementations in which the third conductor portion 83 is omitted, the first and/or second conductor portions 81, 82 can have a parasitic capacitance to the substrate 88 (e.g., to n-type or p-type diffusion regions) and/or to other structures of the IC 80. As used herein, the term "back-plate" of a capacitor that includes a first plate and a second plate can refer to a node of an IC that operates with the first plate and/or the second plate as a parasitic capacitor.

Charging and/or discharging the parasitic capacitance associated with the back-plate of a capacitor can generate an input offset current in an adaptive level shifter. To aid in preventing or reducing input offset current associated with the back-plate of a capacitor, in some implementations a back-plate of a capacitor can be charged using a buffer circuit, as will be described below.

Figure 10A:
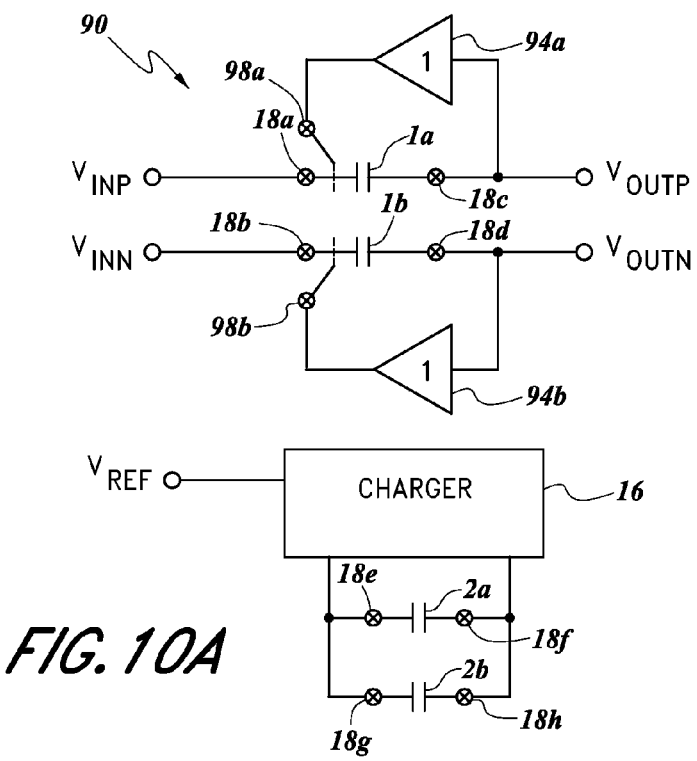
FIGS. 10A and 10B are circuit diagrams illustrating various phases of another embodiment of an adaptive level shifter.
Figure 10B:
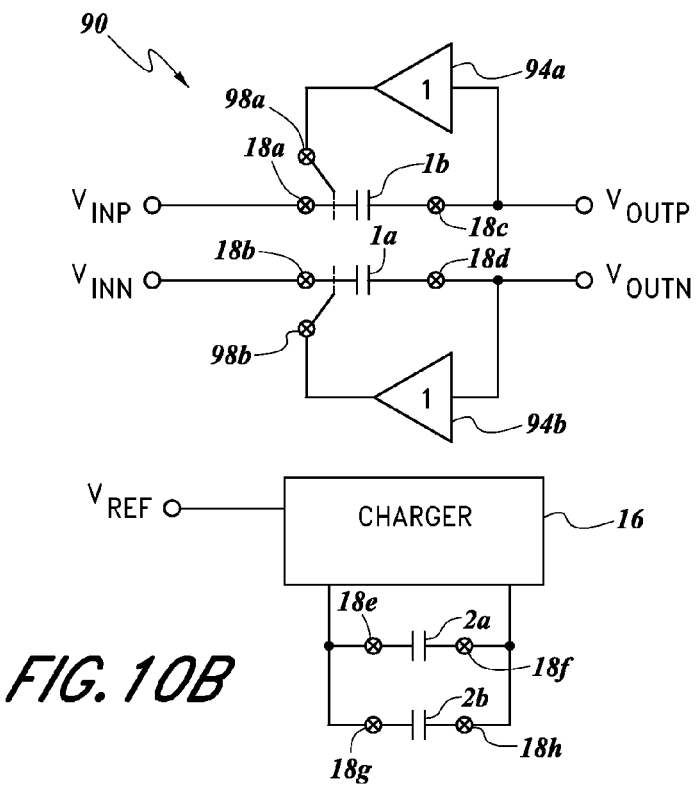

FIGS. 10A and 10B are circuit diagrams illustrating various phases of another embodiment of an adaptive level shifter 90. The adaptive level shifter 90 includes the first voltage input $V_{INP}$, the second voltage input $V_{INN}$, the first voltage output $V_{OUTP}$, the second voltage output $V_{OUTN}$, the first capacitor 1a, the second capacitor 1b, the third capacitor 2a, the fourth capacitor 2b, the first to eighth switching components 18a-18h, the charger block 16, first and second buffer circuits 94a, 94b, and first and second buffer switching components 98a, 98b. FIGS. 10A and 10B illustrate the electrical connectivity of the adaptive level shifter 90 during a first phase and during a second phase, respectively.

The adaptive level shifter 90 of FIGS. 10A and 10B is similar to the adaptive level shifter 20 of FIGS. 2A and 2B. However, in contrast to the adaptive level shifter 20 of FIGS. 2A and 2B, the adaptive level shifter 90 of FIGS. 10A and 10B further includes the first and second buffer circuits 94a, 94b and the first and second buffer switching components 98a, 98b. Additionally, in FIGS. 10A and 10B, the back-plate structures of the first and second capacitors 1a, 1b have been illustrated. The first buffer circuit 94a includes an input electrically connected to the first voltage output $V_{OUTP}$ and an output electrically connected to the first buffer switching component 98a. The second buffer circuit 94b includes an input electrically connected to the second voltage output $V_{OUTN}$ and an output electrically connected to the second buffer switching component 98b. The gain of each of the first and second buffer circuits 94a, 94b can be configured to be equal to one so that the voltage at the output of the first buffer circuit 94a is about equal to the voltage at the input of the first buffer circuit 94a, and so that the voltage at the output of the second buffer circuit 94b is about equal to the voltage at the input of the second buffer circuit 94b.

The first and second buffer circuits 94a, 94b and the first and second buffer switching components 98a, 98b can be used to reduce an input offset current of the adaptive level shifter 90. For example, during the first phase of the adaptive level shifter 90 shown in FIG. 10A, the first and second buffer switching components 98a, 98b can be configured to electrically connect the outputs of the first and second buffer circuits 94a, 94b to the back-plates of the first and second capacitors 1a, 1b, respectively, thereby charging the back-plates of the first and second capacitors 1a, 1b to voltages about equal to the first and second voltage outputs $V_{OUTP}$, $V_{OUTN}$, respectively. Additionally, during the second phase of the adaptive level shifter 90 shown in FIG. 10B, the first and second buffer switching components 98a, 98b can be configured to electrically connect the outputs of the first and second buffer circuits 94a, 94b to the back-plates of the second and first capacitors 1b, 1a, respectively, thereby charging the back-plates of the second and first capacitors 1b, 1a to voltages about equal to the first and second voltage outputs $V_{OUTP}$, $V_{OUTN}$, respectively.

By electrically connecting the first and second buffer circuits 94a, 94b and the first and second buffer switching components 98a, 98b in this manner, a current associated with charging and/or discharging the back-plates of the first and second capacitors $1a$, $1b$ can be provided by the first and second buffer circuits $94a$, $94b$, rather than by circuitry generating a differential input signal on the first and second voltage inputs $V_{INP}$, $V_{INN}$. Accordingly, the first and second buffer circuits $94a$, $94b$ and the first and second buffer switching components $98a$, $98b$ can be used to reduce an input offset current of the adaptive level shifter $90$.

Although FIGS. 10A and 10B illustrate the electrical connectivity of the adaptive level shifter $90$ during a first phase and during a second phase, respectively, the first and second buffer circuits $94a$, $94b$ can be configured to charge the back-plates of the second pair of capacitors $2a$, $2b$ over a third phase and a fourth phase of the adaptive level shifter $90$, respectively. For example, during the third phase of the adaptive level shifter $90$, the first and second buffer switching components $98a$, $98b$ can be configured to electrically connect the outputs of the first and second buffer circuits $94a$, $94b$ to the back-plates of the third and fourth capacitors $2a$, $2b$, respectively, thereby charging the back-plates of the third and fourth capacitors $2a$, $2b$ to voltages about equal to the first and second voltage outputs $V_{OUTP}$, $V_{OUTN}$, respectively. Additionally, during the fourth phase of the adaptive level shifter $90$, the first and second buffer switching components $98a$, $98b$ can be configured to electrically connect the outputs of the first and second buffer circuits $94a$, $94b$ to the back-plates of the fourth and third capacitors $2b$, $2a$, respectively, thereby charging the back-plates of the fourth and third capacitors $2b$, $2a$ to voltages about equal to the first and second voltage outputs $V_{OUTP}$, $V_{OUTN}$, respectively.

Although FIGS. 10A and 10B illustrate a configuration in which the inputs of the first and second buffer circuits $94a$, $94b$ are electrically connected to the first and second voltage outputs $V_{OUTP}$, $V_{OUTN}$, respectively, the inputs of the first and second buffer circuits $94a$, $94b$ can be electrically connected in other ways, including, for example, to the first and second voltage inputs $V_{INP}$, $V_{INN}$ of the adaptive level shifter $90$.

Although the first and second buffer circuits $94a$, $94b$ and the first and second buffer switching components $98a$, $98b$ can be used to reduce an input offset current of the adaptive level shifter $90$, in some implementations charging the back-plate of the capacitors can result in a common-mode voltage glitch on the first and second voltage inputs $V_{INP}$, $V_{INN}$ and/or on the first and second voltage outputs $V_{OUTP}$, $V_{OUTN}$ of the adaptive level shifter $90$.

In one embodiment, the adaptive level shifter $90$ is configured to include pre-charge phases in which the back-plate of a capacitor is pre-charged before being inserted between an input and an output of the adaptive level shifter $90$. For example, before inserting the first capacitor $1a$ between the first voltage input $V_{INP}$ and the first voltage output $V_{OUTP}$ and the second capacitor $1b$ between the second voltage input $V_{INN}$ and the second voltage output $V_{OUTN}$ during the first phase of the adaptive level shifter $90$ shown in FIG. 10A, the adaptive level shifter $90$ can be configured to include a first pre-charge phase in which the back-plates of the first and second capacitors $1a$, $1b$ can be pre-charged to the voltages of the first and second voltage outputs $V_{OUTP}$, $V_{OUTN}$, respectively. For example, the back-plates of the first and second capacitors $1a$, $1b$ can be connected to the outputs of the first and second buffer circuits $94a$, $94b$ through the first and second buffer switching components $98a$, $98b$, respectively. Similarly, before inserting the second capacitor $1b$ between the first voltage input $V_{INP}$ and the first voltage output $V_{OUTP}$ and the first capacitor $1a$ between the second voltage input $V_{INN}$ and the second voltage output $V_{OUTN}$ during the second phase of the adaptive level shifter $90$ shown in FIG. 10B, the adaptive level shifter $90$ can be configured to include a second pre-charge phase in which the back-plates of the second and first capacitors $1b$, $1a$ can be pre-charged to the voltages of the first and second voltage outputs $V_{OUTP}$, $V_{OUTN}$, respectively. For example, the back-plates of the second and first capacitors $1b$, $1a$ can be connected to the outputs of the first and second buffer circuits $94a$, $94b$ through the first and second buffer switching components $98a$, $98b$, respectively.

The adaptive level shifter $90$ can also include pre-charge phases associated with pre-charging the back-plates of the second pair of capacitors $2a$, $2b$. For example, before inserting the third capacitor $2a$ between the first voltage input $V_{INP}$ and the first voltage output $V_{OUTP}$ and the fourth capacitor $2b$ between the second voltage input $V_{INN}$ and the second voltage output $V_{OUTN}$ during the third phase of the adaptive level shifter $90$, the adaptive level shifter $90$ can be configured to include a third pre-charge phase in which the back-plates of the third and fourth capacitors $2a$, $2b$ can be pre-charged to the voltages of the first and second voltage outputs $V_{OUTP}$, $V_{OUTN}$, respectively. For example, the back-plates of the third and fourth capacitors $2a$, $2b$ can be connected to the outputs of the first and second buffer circuits $94a$, $94b$ through the first and second buffer switching components $98a$, $98b$, respectively. Similarly, before inserting the fourth capacitor $2b$ between the first voltage input $V_{INP}$ and the first voltage output $V_{OUTP}$ and the third capacitor $2a$ between the second voltage input $V_{INN}$ and the second voltage output $V_{OUTN}$ during the fourth phase of the adaptive level shifter $90$, the adaptive level shifter $90$ can be configured to include a fourth pre-charge phase in which the back-plates of the fourth and third capacitors $2b$, $2a$ can be pre-charged to the voltages of the first and second voltage outputs $V_{OUTP}$, $V_{OUTN}$, respectively. For example, the back-plates of the fourth and third capacitors $2b$, $2a$ can be connected to the outputs of the first and second buffer circuits $94a$, $94b$ through the first and second buffer switching components $98a$, $98b$, respectively.

Accordingly, in some implementations, the adaptive level shifter $90$ can be configured to switch between the electrical connectivities associated with the first to fourth pre-charge phases and the first to fourth phases over time. For example, the adaptive level shifter $90$ can be configured to switch from the connectivity of the first pre-charge phase to the connectivity of the first phase, from the connectivity of the first phase to the connectivity of the second pre-charge phase, from the connectivity of the second pre-charge phase to the connectivity of the second phase, from the connectivity of the second phase to the connectivity of the third pre-charge phase, from the connectivity of the third pre-charge phase to the connectivity of the third phase, from the connectivity of the third phase to the connectivity of the fourth pre-charge phase, from the connectivity of the fourth pre-charge phase to the connectivity of the fourth phase, and from the connectivity of the fourth phase back to the connectivity of the first pre-charge phase.

Figure 11:
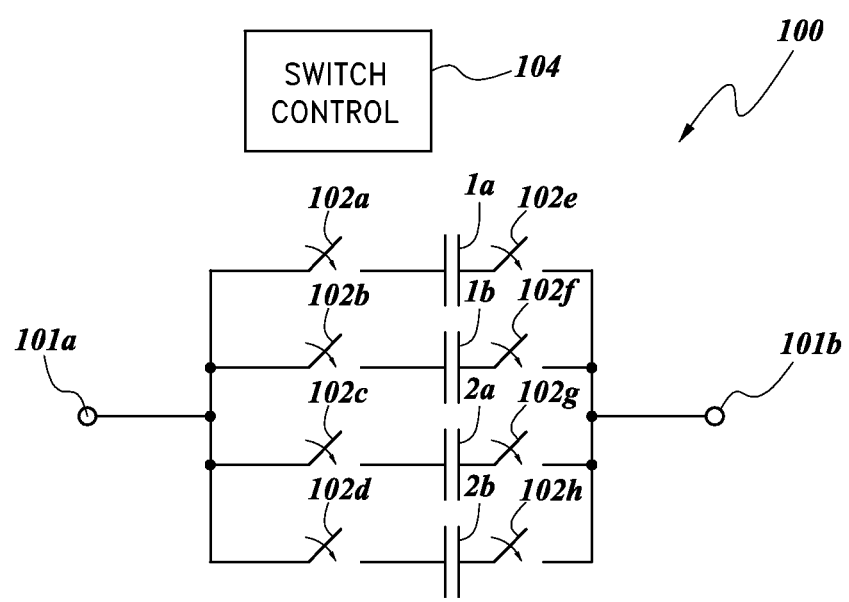
FIG. 11 is a circuit diagram illustrating an example of switching components for use with an adaptive level shifter.

FIG. 11 is a circuit diagram illustrating an example of switching components for use with an adaptive level shifter. The illustrated switching circuit $100$ includes an input $101a$, an output $101b$, first to eighth switches $102a$-$102h$, the first capacitor $1a$, the second capacitor $1b$, the third capacitor $2a$, the fourth capacitor $2b$, and the switch control module $104$.

The first to fourth switches $102a$-$102d$ are electrically connected to the input $101a$, and the fifth to eighth switches $102e$-$102h$ are electrically connected to the output $101b$. The first capacitor $1a$ is disposed between the first switch $102a$ and the fifth switch $102e$, and the second capacitor $1b$ is disposed between the second switch $102b$ and the sixth switch $102f$. Additionally, the third capacitor $2a$ is disposed between the third switch $102c$ and the seventh switch $102g$, and the fourth capacitor 2b is disposed between the fourth switch 102d and the eighth switch 102h.

The switching circuit 100 can operate as a portion of an adaptive level shifter. For example, the switch control module 104 and the first to eighth switches 102a-102h can be adapted to serve as the first and second switching components 18a, 18b of the adaptive level shifter 20 of FIGS. 2A-2D. For example, the input 101a can be electrically connected to the first input $V_{INP}$ of the adaptive level shifter 20 and the output 101b can be electrically connected to the first output $V_{OUTP}$ of the adaptive level shifter 20. Additionally, during the first phase of the adaptive level shifter 20, the switch control module 104 can be configured to close the first and fifth switches 102a, 102e and to open the second to fourth and sixth to eighth switches 102b-102d, 102f-102h. Furthermore, during the second phase of the adaptive level shifter 20, the switch control module 104 can be configured to close the second and sixth switches 102b, 102f and to open the first, third to fifth, and seventh and eighth switches 102a, 102c-102e, 102g, 102h. Additionally, during the third phase of the adaptive level shifter 20, the switch control module 104 can be configured to close the third and seventh switches 102c, 102g and to open the first, second, fourth to sixth and eighth switches 102a-102b, 102d-102f, 102h. Furthermore, during the fourth phase of the adaptive level shifter 20, the switch control module 104 can be configured to close the fourth and eighth switches 102d, 102h and to open the first to third and fifth to seventh switches 102a-102c, 102e-102g.

Although FIG. 11 illustrates one example of a switching circuit suitable for use with the adaptive level shifters described herein, persons having ordinary skill in the art will appreciate that any other suitable switching circuit can be used.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the Figures depict example arrangements of elements and components, additional intervening elements, devices, features, or components may be present in an actual embodiment (assuming that the functionality of the depicted circuits is not adversely affected).

Applications

Devices employing the above described schemes can be implemented into various electronic devices. Examples of the electronic devices can include, but are not limited to, medical imaging and monitoring, consumer electronic products, parts of the consumer electronic products, electronic test equipment, etc. Examples of the electronic devices can also include memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus, comprising:
a level shifter having a first input, a second input, a first output, and a second output, the first and second inputs configured to receive a differential input voltage signal and the first and second outputs configured to provide a differential output voltage signal, the level shifter comprising:
a plurality of capacitors comprising a first capacitor and a second capacitor;
a plurality of switches electrically coupled to the plurality of capacitors, wherein the level shifter is configured to control the electrical connectivity of the plurality of capacitors via the plurality of switches over at least a first phase, a second phase, a third phase, and a fourth phase; and
a charger block configured to charge the first and second capacitors during at least a portion of the third and fourth phases to a shift voltage about equal to a difference in voltage between a common-mode voltage level of the differential input voltage signal and a reference voltage;
wherein the plurality of switches are configured to electrically connect the first capacitor between the first input and first output during the first phase and between the second input and the second output during the second phase, and
wherein the plurality of switches are further configured to electrically connect the second capacitor between the second input and second output during the first phase and between the first input and the first output during the second phase,
wherein the level shifter is configured to control a common-mode voltage level of the first and second outputs to be about equal to the reference voltage, and wherein the level shifter is configured to control a voltage difference between the first and second outputs to be about equal to a voltage difference between the first and second inputs.

2. The apparatus of claim 1,
wherein the plurality of capacitors further comprises a third capacitor and a fourth capacitor, and
wherein the charger block is further configured to charge the third and fourth capacitors during at least a portion of the first and second phases to the shift voltage, and
wherein the plurality of switches are further configured to electrically connect the third capacitor between the first input and the first output during the third phase and between the second input and the second output during the fourth phase, and
wherein the plurality of switches are further configured to electrically connect the fourth capacitor between the second input and second output during the third phase and between the first input and the first output during the fourth phase.

3. The apparatus of claim 2, wherein the plurality of capacitors further comprises a fifth capacitor and a sixth capacitor, wherein the plurality of switches are further configured to electrically connect the fifth capacitor between the first input and first output during the first and third phases and between the second input and the second output during the second and fourth phases, and wherein the plurality of switches are further configured to electrically connect the sixth capacitor between the first input and first output during the second and fourth phases and between the second input and the second output during the first and third phases.

4. The apparatus of claim 1, wherein the charger block is configured to electrically connect a first end of the first capacitor to the first input and a second end of the first capacitor to the reference voltage during the third phase, and wherein the charger block is further configured to electrically connect a first end of the second capacitor to the second input and a second end of the second capacitor to the reference voltage during the third phase, and wherein the charger block is further configured to electrically connect the first ends of the first and second capacitors together and the second ends of the first and second capacitors to the reference voltage during the fourth phase.

5. An apparatus, comprising:
  a level shifter having a first input, a second input, a first output, and a second output, the first and second inputs configured to receive a differential input voltage signal and the first and second outputs configured to provide a differential output voltage signal, the level shifter comprising:
    a plurality of capacitors comprising a first capacitor and a second capacitor;
    a plurality of switches electrically coupled to the plurality of capacitors, wherein the level shifter is configured to control the electrical connectivity of the plurality of capacitors via the plurality of switches over at least a first phase, a second phase, a third phase, and a fourth phase; and
    a charger block configured to charge the first and second capacitors during at least a portion of the third and fourth phases to a shift voltage about equal to a difference in voltage between a common-mode voltage level of the differential input voltage signal and a reference voltage;
    wherein the plurality of switches are configured to electrically connect the first capacitor between the first input and first output during the first phase and between the second input and the second output during the second phase, and
    wherein the plurality of switches are further configured to electrically connect the second capacitor between the second input and second output during the first phase and between the first input and the first output during the second phase,
  wherein the charger block comprises a first amplification block and a second amplification block each including a non-inverted input, an inverted input, and an output, wherein the inverted inputs of the first and second amplification blocks are electrically connected to the first and second inputs of the level shifter, respectively, and wherein the outputs of the first and second amplification blocks are electrically connected to the inverted inputs of the first and second amplification blocks, respectively.

6. The apparatus of claim 5, wherein the charger block further comprises a first resistor and a second resistor, wherein the first resistor includes a first end electrically connected to the output of the first amplification block and the second resistor includes a first end electrically connected to the output of the second amplification block, and wherein the first and second resistors each include a second end electrically connected together at a first node configured to have a voltage about equal to the common-mode voltage level of the differential input voltage signal.

7. The apparatus of claim 6, wherein the charger block is configured to electrically connect the first and second capacitors between the reference voltage and the first node during at least a portion of the third and fourth phases.

8. The apparatus of claim 5, wherein the charger block is configured to electrically connect a first end of the first capacitor to the output of the first amplification block and a second end of the first capacitor to the reference voltage during the third phase, and wherein the charger block is further configured to electrically connect a first end of the second capacitor to the output of the second amplification block and a second end of the second capacitor to the reference voltage during the third phase, and wherein the charger block is further configured to electrically connect the first ends of the first and second capacitors to each other and to electrically connect the second ends of the first and second capacitors to each other and to the reference voltage during the fourth phase.

9. An apparatus, comprising:
  a level shifter having a first input, a second input, a first output, and a second output, the first and second inputs configured to receive a differential input voltage signal and the first and second outputs configured to provide a differential output voltage signal, the level shifter comprising:
    a plurality of capacitors comprising a first capacitor and a second capacitor;
    a plurality of switches electrically coupled to the plurality of capacitors, wherein the level shifter is configured to control the electrical connectivity of the plurality of capacitors via the plurality of switches over at least a first phase, a second phase, a third phase, and a fourth phase; and
    a charger block configured to charge the first and second capacitors during at least a portion of the third and fourth phases to a shift voltage about equal to a difference in voltage between a common-mode voltage level of the differential input voltage signal and a reference voltage;
    wherein the plurality of switches are configured to electrically connect the first capacitor between the first input and first output during the first phase and between the second input and the second output during the second phase, and
    wherein the plurality of switches are further configured to electrically connect the second capacitor between the second input and second output during the first phase and between the first input and the first output during the second phase,
  wherein the charger block includes a first amplification block and a second amplification block each including a non-inverted input, an inverted input, and an output, wherein the inverted inputs of the first and second amplification blocks are electrically connected to the first and second outputs of the level shifter, respectively, and wherein the outputs of the first and second amplification blocks are electrically connected to the inverted inputs of the first and second amplification blocks, respectively.

10. The apparatus of claim 9, wherein the charger block further includes a third amplification block, a first feedback capacitor and a second feedback capacitor, the first feedback capacitor electrically connected between a non-inverted input and an inverted output of the third amplification block and the second feedback capacitor electrically connected between an inverted input and a non-inverted output of the third amplification block, wherein the third amplification block is configured to amplify a difference between the reference voltage and a signal generated using the first and second amplification blocks so as to generate a voltage about equal to the shift voltage between the non-inverted and inverted outputs of the third amplification block.

11. The apparatus of claim 10, wherein the charger block further includes a first resistor and a second resistor, wherein the first resistor includes a first end electrically connected to the output of the first amplification block and a second end electrically connected to the non-inverted input of the third amplification block, and wherein the second resistor includes a first end electrically connected to the output of the second amplification block and a second end electrically connected to the non-inverted input of the third amplification block.

12. The apparatus of claim 11, wherein the charger block further includes a third resistor disposed between the inverted input of the third amplification block and the reference voltage.

13. The apparatus of claim 10, wherein the charger block further includes a first capacitor, a second capacitor, a third capacitor, and a plurality of switches, wherein during the first phase the plurality of switches of the charger block are configured to electrically connect the outputs of the first and second amplification blocks to the first and second capacitors of the charger block, respectively, and wherein during the first phase the plurality of switches of the charger block are configured to electrically connect the third capacitor of the charger block to the reference voltage, and wherein during the second phase the plurality of switches of the charger block are configured to electrically connect the non-inverted input of the third amplification block to the first and second capacitors of the charger block, and wherein during the second phase the plurality of switches of the charger block are configured to electrically connect the inverted input of the third amplification block to the third capacitor of the charger block.

14. The apparatus of claim 1, further comprising a first buffer circuit and a second buffer circuit for charging at least a back-plate of the first capacitor and a back-plate of the second capacitor.

15. The apparatus of claim 14, wherein the first buffer circuit is configured to charge the back-plate of the first capacitor during the first phase and to charge the back-plate of the second capacitor during the second phase, and wherein the second buffer circuit is configured to charge the back-plate of the second capacitor during the first phase and to charge the back-plate of the first capacitor during the second phase.

16. The apparatus of claim 1, further comprising an integrated circuit (IC), wherein the level shifter is disposed in the IC, and wherein the IC includes a first pad electrically connected to the first input and a second pad electrically connected to the second input.

17. The apparatus of claim 16, further comprising an amplification block disposed in the IC, wherein the amplification block is configured to receive the differential output voltage signal from the shifter.

18. The apparatus of claim 1, wherein the level shifter is configured to control a magnitude of the differential output voltage signal to be about equal to a magnitude of the differential input voltage signal.

19. The apparatus of claim 1, wherein the level shifter further comprises a switch control module, the switch control module configured to control the electrical connectivity of the plurality of capacitors via the plurality of switches.

20. An apparatus, comprising:
a level shifter having a first input, a second input, a first output, and a second output, the first and second inputs configured to receive a differential input voltage signal and the first and second outputs configured to provide a differential output voltage signal, the level shifter comprising:
a switch control module;
a plurality of capacitors comprising a first capacitor and a second capacitor;
a plurality of switches electrically coupled to the plurality of capacitors, wherein the switch control module is configured to control the electrical connectivity of the plurality of capacitors via the plurality of switches over at least a first phase, a second phase, a third phase, and a fourth phase; and
a means for charging configured to charge the first and second capacitors during at least a portion of the third and fourth phases to a shift voltage about equal to a difference in voltage between a common-mode voltage level of the differential input voltage signal and a reference voltage;
wherein the switch control module is configured to electrically connect the first capacitor between the first input and first output during the first phase and between the second input and the second output during the second phase via the plurality of switches, and
wherein the switch control module is further configured to electrically connect the second capacitor between the second input and second output during the first phase and between the first input and the first output during the second phase via the plurality of switches
wherein the level shifter is configured to control a common-mode voltage level of the first and second outputs to be about equal to the reference voltage, and wherein the level shifter is configured to control a voltage difference between the first and second outputs to be about equal to a voltage difference between the first and second inputs.

21. The apparatus of claim 20,
wherein the plurality of capacitors further comprises a third capacitor and a fourth capacitor, and
wherein the charger block is further configured to charge the third and fourth capacitors during at least a portion of the first and second phases to the shift voltage, and
wherein the switch control module is further configured to electrically connect the third capacitor between the first input and the first output during the third phase and between the second input and the second output during the fourth phase via the plurality of switches, and
wherein the switch control module is further configured to electrically connect the fourth capacitor between the second input and second output during the third phase and between the first input and the first output during the fourth phase via the plurality of switches.

22. An apparatus, comprising:
a level shifter having a first input, a second input, a first output, and a second output, the first and second inputs configured to receive a differential input voltage signal and the first and second outputs configured to provide a differential output voltage signal, the level shifter comprising:
a switch control module;
a plurality of capacitors comprising a first capacitor and a second capacitor;

a plurality of switches electrically coupled to the plurality of capacitors, wherein the switch control module is configured to control the electrical connectivity of the plurality of capacitors via the plurality of switches over at least a first phase, a second phase, a third phase, and a fourth phase; and a means for charging configured to charge the first and second capacitors during at least a portion of the third and fourth phases to a shift voltage about equal to a difference in voltage between a common-mode voltage level of the differential input voltage signal and a reference voltage;

wherein the switch control module is configured to electrically connect the first capacitor between the first input and first output during the first phase and between the second input and the second output during the second phase via the plurality of switches, and wherein the switch control module is further configured to electrically connect the second capacitor between the second input and second output during the first phase and between the first input and the first output during the second phase via the plurality of switches, wherein the means for charging includes a first amplification block and a second amplification block each including a non-inverted input, an inverted input, and an output, wherein the inverted inputs of the first and second amplification blocks are electrically connected to the first and second outputs of the level shifter, respectively, and wherein the outputs of the first and second amplification blocks are electrically connected to the inverted inputs of the first and second amplification blocks, respectively.

23. A method of level shifting, the method comprising:

receiving a differential input voltage signal between a first input and a second input of a level shifter;

charging each of a first capacitor and a second capacitor to a voltage that is about equal to a difference between a common-mode voltage of the differential input voltage signal and a reference voltage;

electrically connecting the first capacitor between the first input and a first output of the level shifter during a first phase of the level shifter and the second capacitor between the second input and a second output of the level shifter during the first phase;

switching connections for the first capacitor and the second capacitor such that the first capacitor is electrically connected between the second input and the second output during a second phase of the level shifter and the second capacitor is electrically connected between the first input and the first output during the second phase;

controlling a common-mode voltage level of the first and second outputs to be about equal to the reference voltage using the level shifter; and controlling a voltage difference between the first and second outputs to be about equal to a voltage difference between the first and second inputs.

* * * * *